(12) United States Patent
Misaki

(10) Patent No.: US 8,791,463 B2
(45) Date of Patent: Jul. 29, 2014

(54) THIN-FILM TRANSISTOR SUBSTRATE

(75) Inventor: Katsunori Misaki, Yonago (JP)

(73) Assignee: Sharp Kabushiki Kaisha, Osaka (JP)

( * ) Notice: Subject to any disclaimer, the term of this patent is extended or adjusted under 35 U.S.C. 154(b) by 72 days.

(21) Appl. No.: 13/578,738

(22) PCT Filed: Apr. 7, 2011

(86) PCT No.: PCT/JP2011/002077
§ 371 (c)(1),
(2), (4) Date: Aug. 13, 2012

(87) PCT Pub. No.: WO2011/132376
PCT Pub. Date: Oct. 27, 2011

(65) Prior Publication Data
US 2012/0305925 A1 Dec. 6, 2012

(30) Foreign Application Priority Data
Apr. 21, 2010 (JP) ................................ 2010-097713

(51) Int. Cl.
*H01L 27/14* (2006.01)
*H01L 29/04* (2006.01)

(52) U.S. Cl.
USPC ................................ 257/72; 257/59; 438/34

(58) Field of Classification Search
CPC ............ H01L 27/1214; H01L 27/1248; H01L 29/78669
USPC ......................................... 257/59, 72; 438/34
See application file for complete search history.

(56) References Cited

U.S. PATENT DOCUMENTS

| | | | |
|---|---|---|---|
| 6,674,093 B1 * | 1/2004 | Tanaka et al. | 257/72 |
| 2001/0008434 A1 * | 7/2001 | Battersby et al. | 349/38 |
| 2004/0084672 A1 * | 5/2004 | Tanaka et al. | 257/52 |
| 2005/0124088 A1 * | 6/2005 | Chen | 438/30 |
| 2006/0267094 A1 | 11/2006 | Ahn et al. | |
| 2008/0251789 A1 * | 10/2008 | Chen | 257/59 |
| 2009/0001374 A1 * | 1/2009 | Inoue et al. | 257/59 |

(Continued)

FOREIGN PATENT DOCUMENTS

| | | |
|---|---|---|
| JP | 2003-179069 A | 6/2003 |
| JP | 2006-106110 A | 4/2006 |

(Continued)

OTHER PUBLICATIONS

Official Communication issued in International Patent Application No. PCT/JP2011/002077, mailed on May 17, 2011.

*Primary Examiner* — Cheung Lee
*Assistant Examiner* — Jeremy Joy
(74) *Attorney, Agent, or Firm* — Keating & Bennett, LLP

(57) ABSTRACT

Gate electrodes, a gate insulating layer, and an oxide semiconductor layer are simultaneously formed to form a multi-layer structure, so that an SOG film serves as an etching stopper on channel regions in forming source electrodes and drain electrodes. In the SOG film, channel isolation holes are formed in positions each of which is located between adjacent two of TFTs connected to a common one of the gate lines, and corresponds to the common gate line. The oxide semiconductor layer of the adjacent TFTs is divided in each channel isolation hole. Terminal sections of the gate lines are exposed in the terminal section exposing holes formed in positions each corresponding to a gate line end portion. The pixel electrode is made of a film identical to a film forming one layer included in the drain electrode.

7 Claims, 25 Drawing Sheets

(56) References Cited

U.S. PATENT DOCUMENTS

| | | | |
|---|---|---|---|
| 2009/0051286 A1* | 2/2009 | Yamazaki et al. | 313/512 |
| 2009/0090912 A1* | 4/2009 | Chen | 257/59 |
| 2009/0170291 A1 | 7/2009 | Ahn et al. | |
| 2009/0283762 A1 | 11/2009 | Kimura | |
| 2011/0017999 A1* | 1/2011 | Choi | 257/72 |
| 2011/0165710 A1* | 7/2011 | Yoon et al. | 438/29 |

FOREIGN PATENT DOCUMENTS

| | | |
|---|---|---|
| JP | 2006-332661 A | 12/2006 |
| JP | 2007-258675 A | 10/2007 |
| JP | 2009-302520 A | 12/2009 |

* cited by examiner

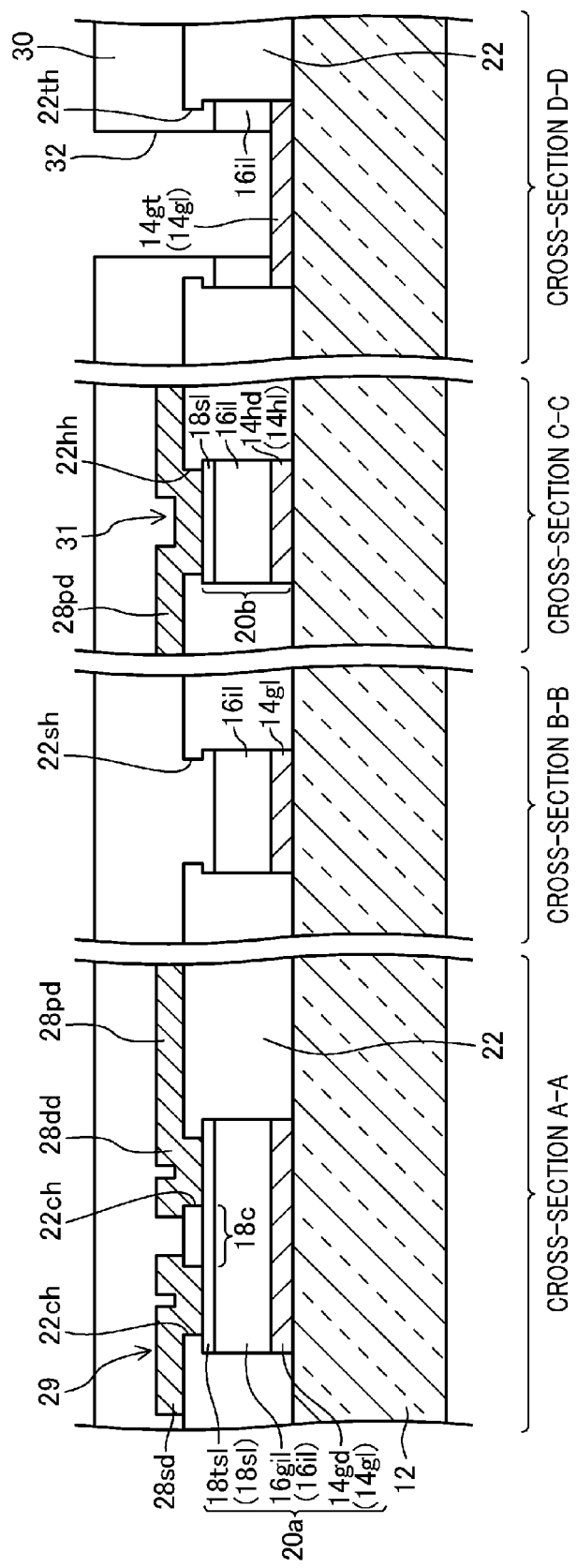

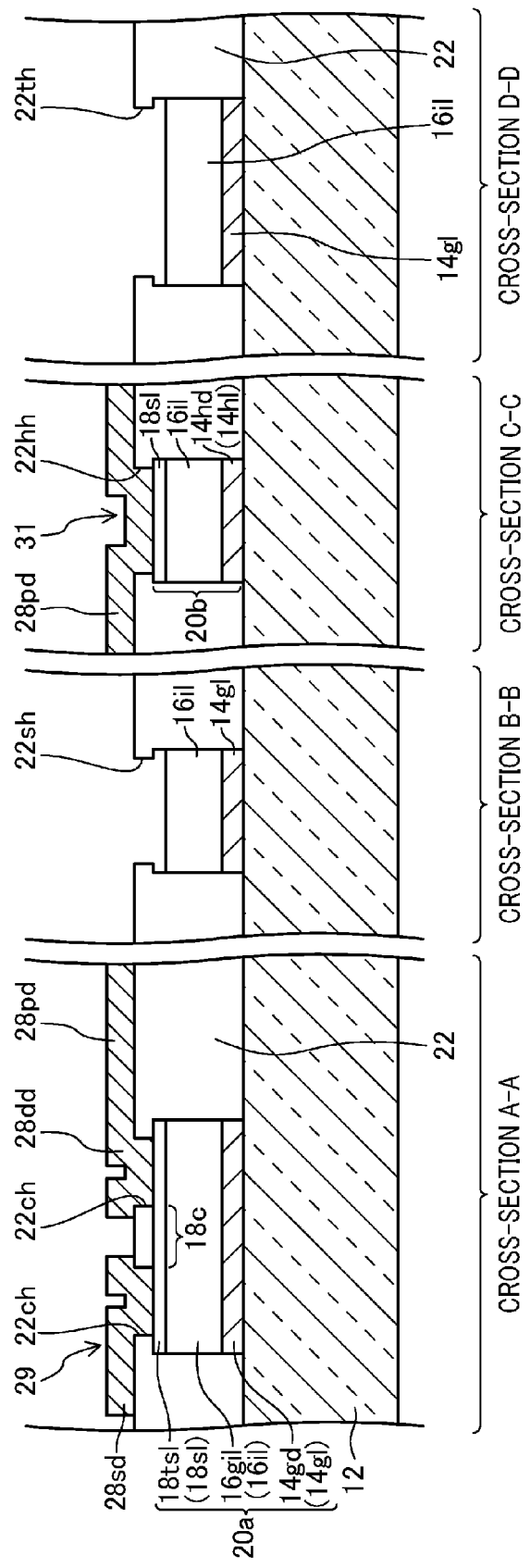

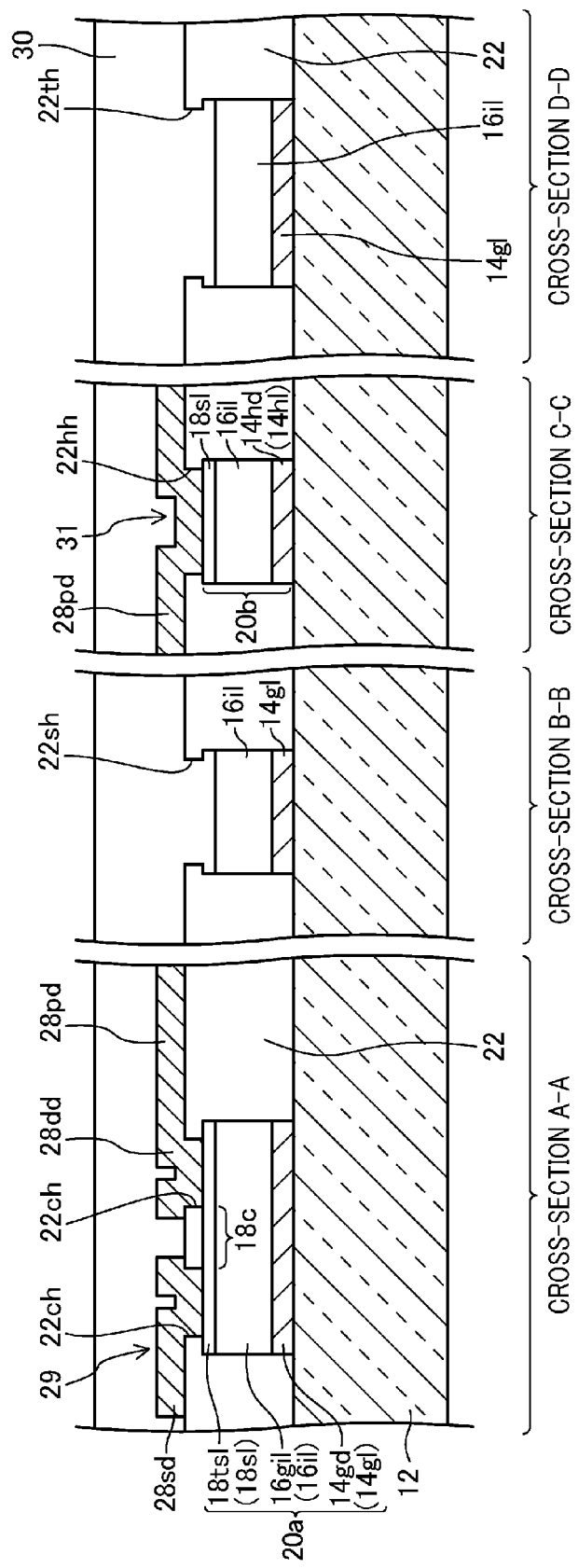

THIN-FILM TRANSISTOR SUBSTRATE

TECHNICAL FIELD

The present invention relates to thin film transistor (hereinafter referred to as TFT) substrates, liquid crystal display devices including the same, and methods for fabricating the TFT substrates. The present invention relates specifically to a TFT substrate including a TFT using a semiconductor layer made of an oxide semiconductor, a liquid crystal display device including the same, and a method for fabricating the TFT substrate.

BACKGROUND ART

In recent years, in TFT substrates included in liquid crystal display devices, as switching elements of pixels each of which is a minimum unit for forming an image, TFTs using semiconductor layers made of an oxide semiconductor and having satisfactory characteristics such as high mobility, high reliability, and low off currents have been proposed instead of conventional TFTs using semiconductor layers made of amorphous silicon.

A general TFT having a bottom gate structure includes, for example, a gate electrode provided on a glass substrate, a gate insulating film provided to cover the gate electrode, a semiconductor layer provided on the gate insulating film and above the gate electrode, a source electrode and a drain electrode provided on the semiconductor layer to be spaced apart from each other. In part of the semiconductor layer which is exposed between the source electrode and the drain electrode, a channel region is formed. The TFT having the bottom gate structure is covered with a protective insulating film, and a pixel electrode formed on the protective insulating film is connected to the drain electrode via a contact hole formed in the protective insulating film.

A TFT substrate including the TFT having the bottom gate structure as described above can be fabricated by, for example, repeating a series of steps of sequentially forming an etched film and a photosensitive resin film on the glass substrate, exposing the photosensitive resin film via a photomask and then developing the photosensitive resin film to form a resist pattern, and etching the etched film exposed form the resist pattern. The same applies to the TFT substrates including the TFTs using the oxide semiconductor layers.

For example, Patent Document 1 describes a method for fabricating a TFT substrate including a TFT having a bottom gate structure using an oxide semiconductor layer by using five photomasks. In this method, by using a first photomask, a gate electrode is formed on a glass substrate, and a gate insulating film is formed o cover the gate electrode. Then, by using a second photomask, the oxide semiconductor layer is formed. Subsequently, by using a third photomask, a source electrode and a drain electrode are formed. Next, a protective insulating film (interlayer insulating film) is formed to cover the source electrode and the drain electrode, and by using a fourth photomask, a contact hole is formed in the protective insulating film. Finally, by using a fifth photomask, a pixel electrode is formed. The TFT substrate can thus be formed.

CITATION LIST

Patent Document

PATENT DOCUMENT 1: Japanese Patent Publication No. 2009-302520

SUMMARY OF THE INVENTION

Technical Problem

However, in the method for fabricating the TFT substrate described in Patent Document 1, when the source electrode and the drain electrode are formed, that is, when a conductive film serving as an etched film is formed to cover the oxide semiconductor layer and the conductive film is patterned by etching by using the photomask, a channel region of the oxide semiconductor layer which is exposed between the source electrode and the drain electrode is damaged by the etching, and even though the oxide semiconductor is used, the characteristics of the TFT are degraded, and display quality may be reduced.

However, when an etching stopper for stopping the etching is simply formed on the channel region of the oxide semiconductor layer, a new photomask is required for forming the etching stopper, and the number of steps included in the above-described series of steps of forming, exposing, developing, and etching the films increases, which increases fabrication cost.

In view of the foregoing, the present invention was devised. It is an objective of the present invention to provide a TFT having satisfactory characteristics by using an oxide semiconductor and to fabricate a TFT substrate including the TFT at low cost.

Solution to the Problem

To achieve the objective, in the present invention, the channel region of the oxide semiconductor layer is protected by an insulating film serving as an etching stopper, while the number of photomasks is reduced.

Specifically, the present invention is directed to a TFT substrate including a base substrate; a plurality of gate lines extending parallel to each other on the base substrate; a plurality of source lines extending parallel to each other in a direction intersecting the gate lines; TFTs each of which is provided at an associated one of intersections of the gate lines and the source lines; and pixel electrodes each of which is provided to an associated one of the TFTs, a liquid crystal display device including the TFT substrate, and a method for fabricating the TFT substrate. Each of the TFTs includes a gate electrode connected to the gate line forming an associated one of the intersections, a gate insulating layer provided on the gate electrode, an oxide semiconductor layer provided on the gate insulating layer and including a channel region overlapping the gate electrode, a source electrode connected to one side of the oxide semiconductor layer and connected to the source line forming the associated one of the intersections, and a drain electrode connected to the other side of the oxide semiconductor layer such that the drain electrode faces the source electrode. In the present invention, the following measures are further taken.

That is, a first invention is the TFT substrate, wherein each of the thin film transistors is configured such that side end faces of the gate electrode, the gate insulating layer, and the oxide semiconductor layer are formed to be flush with one another to form a multilayer structure, a stopper insulating film is provided to cover the multilayer structure, a pair of contact holes for connection to the oxide semiconductor layer is formed in the stopper insulating film to connect the source electrode to the oxide semiconductor layer via one of the contact holes, and to connect the drain electrode to the oxide semiconductor layer via the other of the contact holes, and the stopper insulating film serves as an etching stopper on the channel region when the source electrode and the drain electrode are formed, an insulating layer made of a film identical to a film forming the gate insulating layer is stacked also on the gate lines, the stopper insulating film is provided to cover at least part of side end faces of the gate lines and of the insulating layer, the stopper insulating film has channel isolation holes formed in positions each of which is located between adjacent two of the thin film transistors connected to a common one of the gate lines, and corresponds to the common gate line, where the oxide semiconductor layer of the adjacent thin film transistors is divided in each of the channel isolation holes so as to isolate the channel regions of the adjacent thin film transistors from each other, the stopper insulating film has terminal section exposing holes formed in positions each corresponding to an end portion of the gate line, where the end portion of the gate line is exposed in each of the terminal section exposing holes from the insulating layer to form a terminal section, and each of the pixel electrodes is made of a film identical to at least one layer included in the drain electrode.

A second invention is the TFT substrate of the first invention, wherein each of the channel isolation holes is formed to fit within the position of the stopper insulating film corresponding to the gate line, and the oxide semiconductor layer is formed also in the position corresponding to the gate line, and serves as an etching stopper when the channel isolation holes are formed in the stopper insulating film.

A third invention is the TFT substrate of the first invention, wherein each of the channel isolation holes is formed in the position of the stopper insulating film corresponding to the gate line to extend across the gate line in a width direction of the gate line. A fourth invention is any one of the TFT substrates of the first to third inventions, wherein the TFTs are covered with a protective insulating film.

A fifth invention is the TFT substrate of the fourth invention, wherein each of the drain electrodes includes a transparent conductive layer and a light shielding conductive layer which are sequentially stacked, each of the pixel electrodes is made of a film identical to a film forming the transparent conductive layer, in the protective insulating film, openings are formed in positions each corresponding to the pixel electrode, and the light shielding conductive layer of each of the drain electrodes has an end face facing an associated one of the pixel electrodes, where the end face matches an inner surface of the opening in the protective insulating film.

A sixth invention is the TFT substrate of any one of the first to fifth inventions, wherein the stopper insulating film is made of a spin-on glass material.

A seventh invention is the TFT substrate of any one of the first to sixth invention, wherein the oxide semiconductor layer is made of indium-gallium-zinc oxide-based metal oxide.

An eighth invention is a liquid crystal display device including the TFT substrate of any one of the first to seventh inventions; a counter substrate provided to face the TFT substrate; and a liquid crystal layer provided between the TFT substrate and the counter substrate.

A ninth invention is a method for fabricating the TFT substrate of the first invention, the method including: a first patterning step of sequentially forming a first conductive film, a first insulating film, and an oxide semiconductor film on the base substrate to form a multilayer film, and then patterning the multilayer film by using a first photomask to form the gate lines and the gate electrodes from the first conductive film, the insulating layer from the first insulating film, and the oxide semiconductor layer from the oxide semiconductor film such that a multilayer structure including the gate lines, the gate electrodes, and the insulating layer and the oxide semiconductor layer which are sequentially stacked on the gate lines and the gate electrodes is formed, where part of the insulating layer which correspond to the gate electrodes form the gate insulating layer; a second patterning step of forming a second insulating film to cover the multilayer structure, and then patterning the second insulating film by using a second photomask to form a pair of contact holes extending to the oxide semiconductor layer in positions corresponding to each of the gate electrodes, channel isolation holes extending to the oxide semiconductor layer in positions each of which is located between adjacent two of the gate electrodes connected to a common one of the gate lines, and corresponds to the common gate line, and terminal section exposing holes in positions each corresponding to an end portion of the gate line so that the second insulating film serves as the stopper insulating film; a third patterning step of forming a second conductive film on the stopper insulating film, and then by using the stopper insulating film as an etching stopper, patterning the second conductive film by using a third photomask to form the source lines, the source electrodes, the drain electrodes, and the pixel electrodes, dividing the oxide semiconductor layer by removing part of the oxide semiconductor layer via each of the channel isolation holes so that the divided oxide semiconductor layers of the adjacent gate electrodes connected to the common gate line are isolated from each other, and removing part of the oxide semiconductor layer via each of the terminal section exposing holes to expose the insulating layer; and a fourth patterning step of patterning the insulating layer exposed from the stopper insulating film via the terminal section exposing holes by using a fourth photomask to expose end portions of the gate lines from the insulating layers to form terminal sections of the gate lines.

—Operation—

Next, operation of the present invention will be described.

According to the first invention, the stopper insulating film serves as an etching stopper when the source electrode and the drain electrode are formed. Thus, when the source electrode and the drain electrode are formed, the stopper insulating film protects the channel region of the oxide semiconductor layer. Therefore, the channel region of the oxide semiconductor layer is not damaged by etching, so that it is possible to obtain a TFT having satisfactory characteristics. Moreover, as described in the ninth invention, the TFT substrate having the above-described configuration can be fabricated by using a total of four photomasks in such a manner that a first photomask is used to form a multilayer structure including a gate electrode and a gate line, and an insulating layer and an oxide semiconductor layer which are sequentially stacked on the gate electrode and the gate line, a second photomask is used to form a pair of contact holes for connection to the oxide semiconductor layer, channel isolation holes, and terminal section exposing holes are formed in the stopper insulating film, a third photomask is used to form source lines, source electrodes, drain electrodes, and pixel electrodes, to divide the oxide semiconductor layer above the gate electrodes connected to a common one of the gate lines, to expose the insulating layer in positions each corresponding to an end portion of the gate line from the oxide semiconductor layer, and a fourth photomask is used to expose the end portions of the gate lines to the outside to form terminal sections. Thus, a TFT having satisfactory characteristics can be obtained by using an oxide semiconductor, and a TFT substrate including the TFT can be fabricated at a low cost with the number of photomasks being reduced.

According to the second invention, when the channel isolation holes are formed in the stopper insulating film (second insulating film), the oxide semiconductor layer serves as an etching stopper. Thus, it is not necessary to control etching so that the channel isolation holes do not reach the gate lines in order to prevent damage by etching on the gate lines. This facilitates formation of the channel isolation holes.

According to the third invention, when the source electrode and the gate electrode are formed, part of the oxide semiconductor layer corresponding to a total width of the gate line is exposed in the channel isolation hole. Thus, division of the oxide semiconductor layer above adjacent ones of the gate electrodes connected to a common one of the gate lines can be ensured by removing the part of the oxide semiconductor layer.

According to the fourth invention, the TFTs are covered with the protective insulating film, so that degradation in the TFT performance can be limited to a lesser degree. In many cases, such a protective insulating film is formed by forming an inorganic insulating film by, for example, plasma chemical vapor deposition (CVD), and by patterning the inorganic insulating film. Therefore, as in the case of conventional TFT substrates, when channel regions of an oxide semiconductor layer are exposed to the outside, the channel regions are also damaged by plasma for forming the protective insulating film, which may degrade the characteristics of the TFTs. In contrast, in the fourth invention, the channel regions of the oxide semiconductor layer are covered with and protected by the stopper insulating film, and thus, TFTs are not damaged by plasma for forming the protective insulating film.

According to the fifth invention, the pixel electrodes are made of a film identical with a film forming the transparent conductive layer included in the drain electrodes. Thus, the TFT substrate can be applicable as a TFT substrate included in a transmissive liquid crystal display device. Moreover, when the fourth photomask is used to expose the terminal sections of the gate lines to the outside, openings are formed in the protective insulating film, and simultaneously with forming the openings, or in a self-aligned manner by using the protective insulating film in which the openings has been formed as a mask, the light shielding conductive layer is removed in positions corresponding to the pixel electrodes, so that the TFT substrate having the above-described configuration can be fabricated without increasing the number of the photomasks.

According to the sixth invention, the stopper insulating film is formed by applying a spin-on glass material to cover the multilayer structure by, for example, spin coating or slit coating, and by baking and patterning the film made of the applied material. Thus, unlike the case of forming the stopper insulating film by plasma CVD, the channel region of the oxide semiconductor layer is not subjected to plasma. Therefore, damage to the channel region of the oxide semiconductor layer can be reduced.

According to the seventh invention, satisfactory characteristics of the TFT that are high mobility, high reliability, and low off current are specifically obtained.

According to the eighth invention, the TFT substrates of the first to seventh inventions have excellent characteristics that a TFT having satisfactory characteristics can be obtained by using an oxide semiconductor, and the TFT can be formed at low cost. Thus, display quality can be improved while the cost of the liquid crystal display device itself can be reduced.

Advantageous of the Invention

According to the present invention, the number of photomasks can be reduced, while the channel region of the oxide semiconductor layer can be protected by the stopper insulating film serving as an etching stopper. Thus, a TFT having satisfactory characteristics can be obtained by an oxide semiconductor, and a TFT substrate including the TFT can be fabricated at low cost. Applying the TFT substrate to display devices can increase display quality.

BRIEF DESCRIPTION OF THE DRAWINGS

FIG. 23 is a cross-sectional view illustrating the cross-sectional structures along the line A-A, B-B, C-C, and D-D of FIG. 22.

FIG. 24 is a cross-sectional view illustrating portions corresponding to FIG. 23, wherein source electrodes, drain electrodes, and pixel electrodes are formed in a third patterning step of the third embodiment.

FIG. 25 is a cross-sectional view illustrating the portions corresponding to FIG. 23, wherein a protective insulating film is formed in a fourth patterning step of the third embodiment.

DESCRIPTION OF EMBODIMENTS

Embodiments of the present invention will be described in detail below with reference to the drawings. The present invention is not limited to the following embodiments.

First Embodiment of Invention

Figure 1:
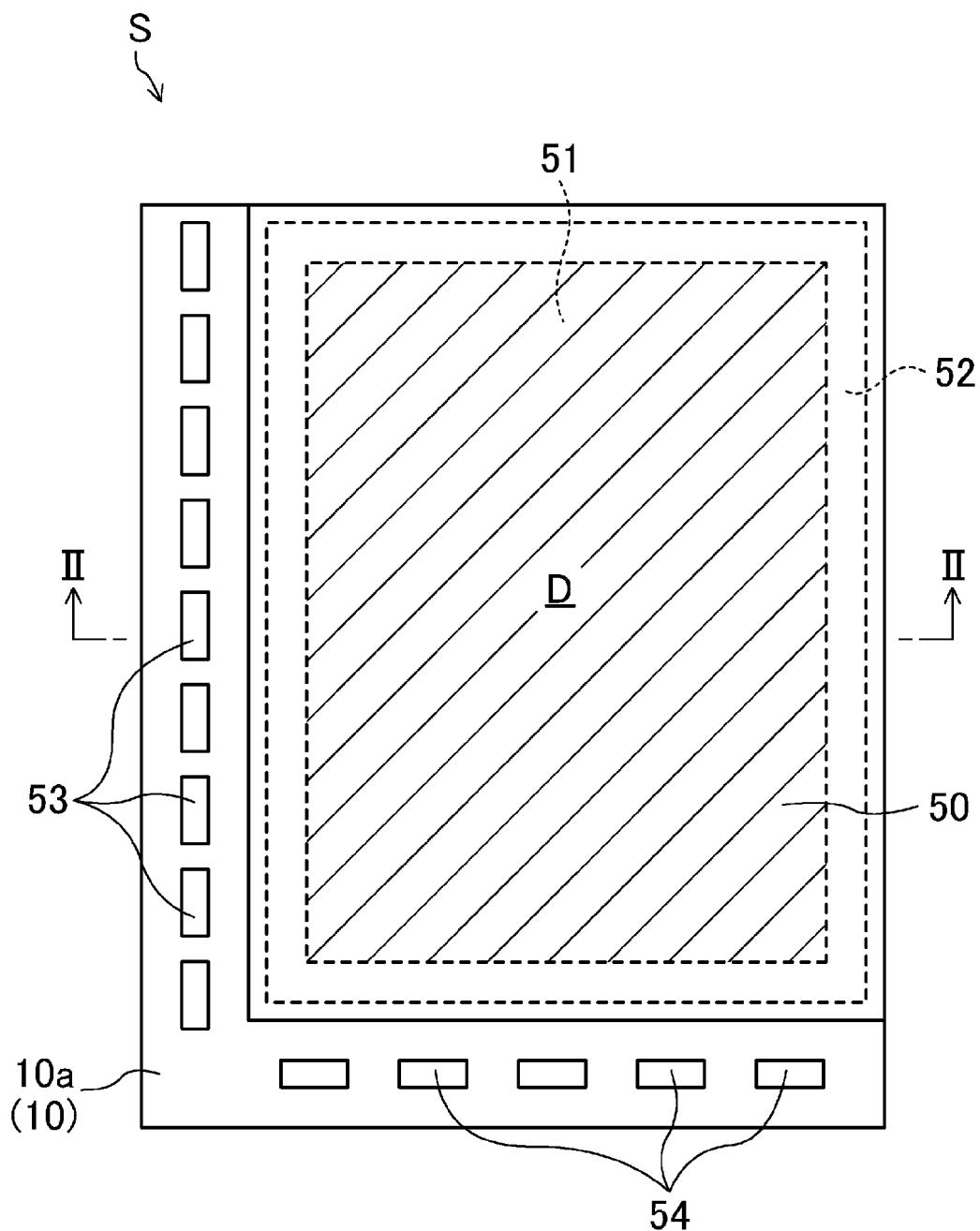
FIG. 1 is a plan view schematically illustrating a liquid crystal display device according to a first embodiment.
Figure 2:
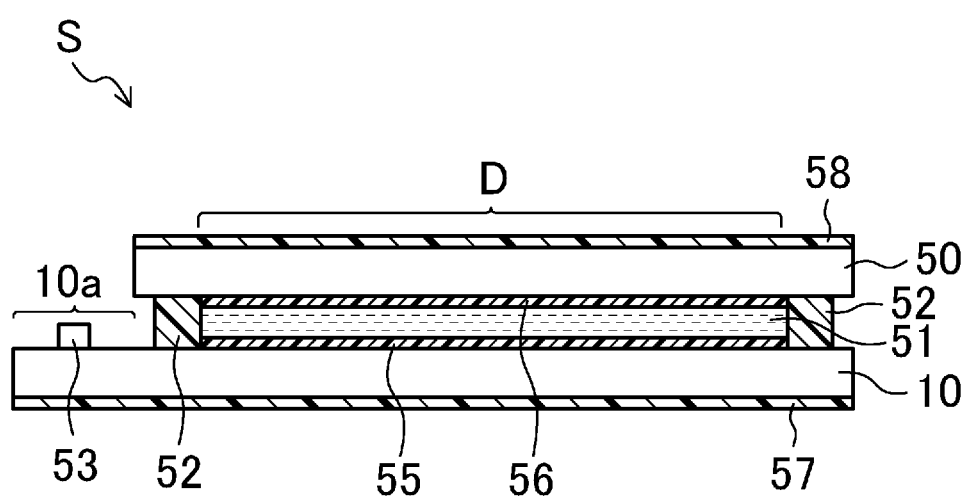
FIG. 2 is a cross-sectional view illustrating the cross-sectional structure along the line II-II of FIG. 1.

FIG. 1 is a plan view schematically illustrating a liquid crystal display device S according to a first embodiment. FIG. 2 is a cross-sectional view schematically illustrating the cross-sectional structure along the line II-II of FIG. 1. Note that in FIG. 1, a polarizing plate 58 of FIG. 2 is omitted.

The liquid crystal display device S includes a TFT substrate 10 and a counter substrate 50 disposed to face each other, a frame-like sealing material 52 adhering an outer peripheral part of the TFT substrate 10 to an outer peripheral part of the counter substrate 50, and a liquid crystal layer 51 enclosed between the TFT substrate 10 and the counter substrate 50 by the sealing material 52.

The liquid crystal display device S is a transmissive liquid crystal display device. The liquid crystal display device S includes a display area D for displaying an image in an area in which the TFT substrate 10 overlaps the counter substrate 50 and which is surrounded by the sealing material 52, that is, in an area in which the liquid crystal layer 51 is provided. The liquid crystal display device S further includes a terminal area 10a provided outside the display area D. The terminal area 10a has for example, an L shape, and is part of the TFT substrate 10 extending beyond the counter substrate 50.

The display area D is, for example, a rectangular area in which a plurality of pixels are aligned in a matrix pattern, where each pixel is a minimum unit for forming an image. On one side of the terminal area 10a (on the left side in FIG. 1), a plurality of gate driver integrated circuit (hereinafter referred to as IC) chips 53 are mounted with an anisotropic conductive film (hereinafter referred to as an ACF) provided between the terminal area 10a and the gate driver IC chips 53. On the other side of the terminal area 10a (on the lower side in FIG. 1), a plurality of source driver IC chips 54 are mounted with the ACF provided between the terminal area 10a and the source driver IC chips 54.

The TFT substrate 10 and the counter substrate 50 have, for example, a rectangular shape. As illustrated in FIG. 2, an alignment layer 55 and an alignment layer 56 are respectively provided on an inner surface of the TFT substrate 10 and an inner surface of the counter substrate 50 which face each other, and a polarizing plate 57 and a polarizing plate 58 are respectively provided on an outer surface of the TFT substrate 10 and an outer surface of the counter substrate 50. The liquid crystal layer 51 is made of a nematic liquid crystal material, or the like having electro-optical characteristics.

Figure 3:
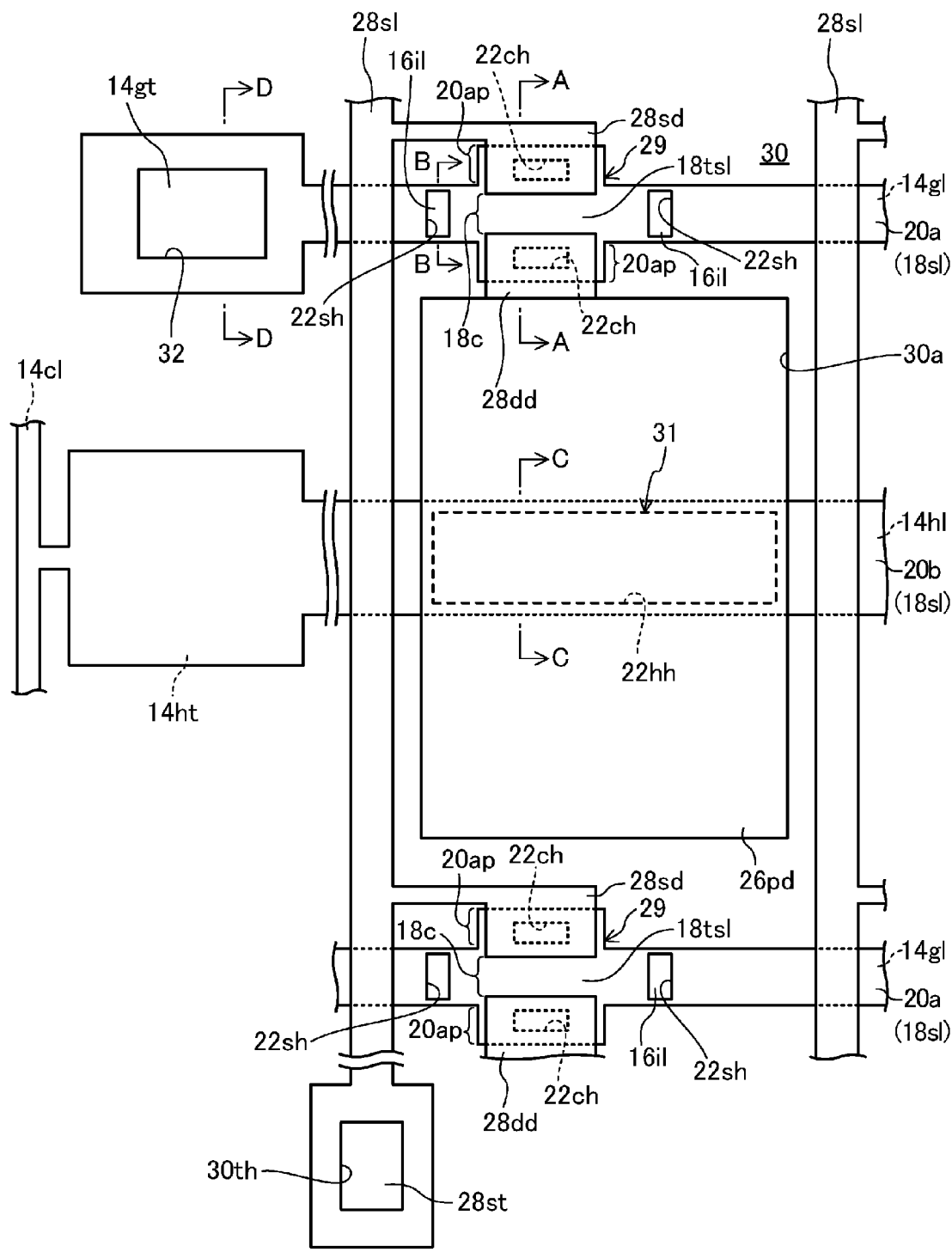
FIG. 3 is a plan view schematically illustrating a configuration of one pixel and terminal sections of a TFT substrate according to the first embodiment.
Figure 4:
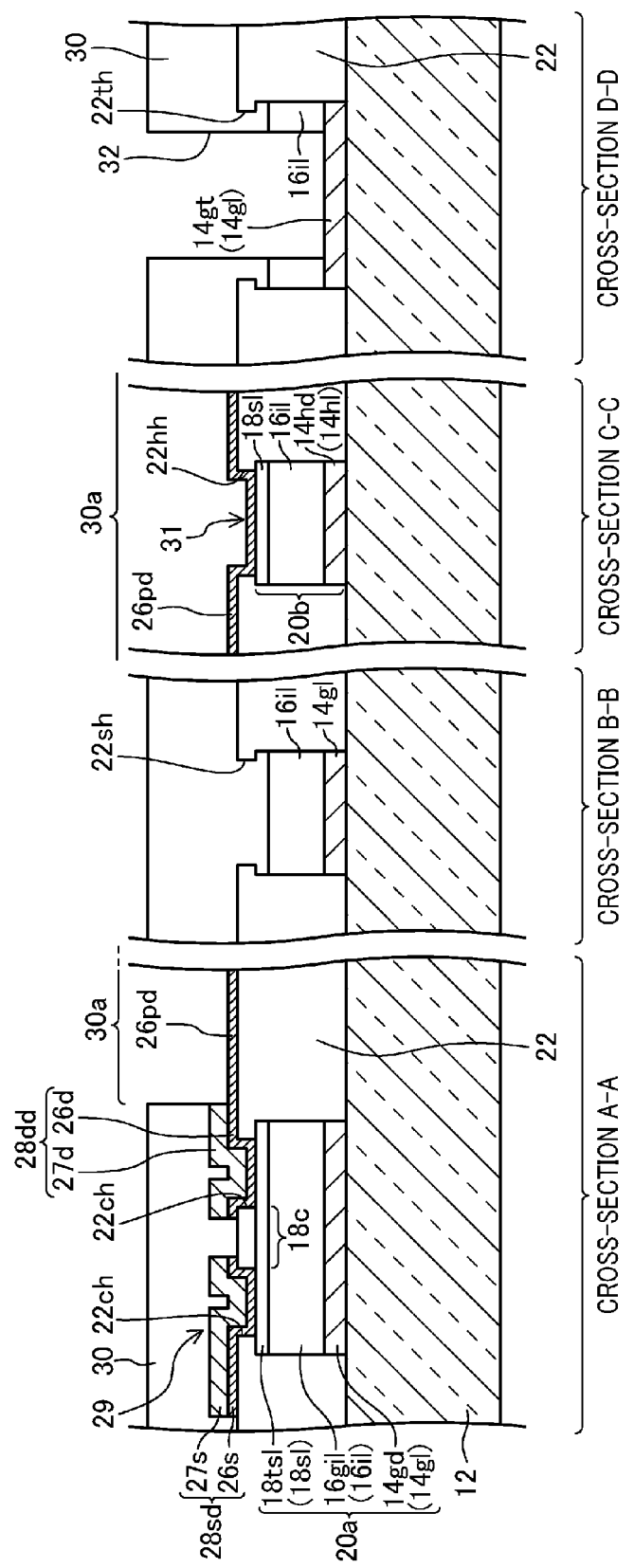
FIG. 4 is a cross-sectional view illustrating the cross-sectional structures along the line A-A, B-B, C-C, and D-D of FIG. 3.

A configuration of the TFT substrate 10 is schematically illustrated in FIG. 3 and FIG. 4. FIG. 3 is a plan view illustrating a configuration of one pixel and terminal sections. FIG. 4 is a cross-sectional view in which the cross-sectional structures along the lines A-A, B-B, C-C, and D-D of FIG. 3 are shown from the left.

The TFT substrate 10 includes an insulating substrate 12 serving as a base substrate illustrated in FIG. 4. As illustrated in FIG. 3, the TFT substrate 10 includes a plurality of gate lines 14g1, a plurality of storage capacitor lines 14h1, and a plurality of source lines 28s1 in the display area D. On the insulating substrate 12, the gate lines 14g1 extend parallel to each other, and the storage capacitor lines 14h1 extend parallel to each other, and are each provided between associated two of the gate lines 14g1. The source lines 28s1 extend parallel to each other in a direction intersecting the gate lines 14g1 and the storage capacitor lines 14h1 via an insulating film 22. Here, the gate lines 14g1 and the source lines 28s1 are arranged to form a lattice pattern as an overall layout, and define pixels. Moreover, across a plurality of pixels aligned in a direction in which the gate lines 14g1 extend, the storage capacitor lines 14h1 extend to traverse center portions the pixels.

Each gate line 14g1 is extended to the terminal area 10a on which the gate driver IC chips 53 are mounted, and the extended tip portion serves as a gate terminal section 14gt illustrated in FIG. 3. The gate terminal section 14gt serves as an electrode which is electrically connected to the gate driver IC chip 53. Moreover, each source line 28s1 is extended to the terminal area 10a on which the source driver IC chips 54 are mounted, and the extended tip portion serves as a source terminal section 28st illustrated in FIG. 3.

Furthermore, both end portions of each storage capacitor line 14h1 extend to the area provided with the sealing material 52, and serve as storage capacitor terminal sections 14ht. The storage capacitor terminal sections 14ht are connected to a common interconnect 14c1 so that storage capacitor terminal sections 14ht are electrically connected to a common electrode of the counter substrate 50, which will be described later, by so-called common transfer, thereby forming electrodes via which a common voltage similar to a voltage of the common electrode is applied to the storage capacitor lines 14h1.

The TFT substrate 10 further includes a TFT 29 and a pixel electrode 26pd at each of intersections of the gate lines 14g1 and the source lines 28s1, that is, at each pixel.

As illustrated in FIG. 4 (cross-section A-A), the TFT 29 includes a gate electrode 14gd, a gate insulating layer 16gi1 provided on the gate electrode 14gd, an oxide semiconductor layer 18ts1 provided on the gate insulating layer 16gi1, and a source electrode 28sd and a drain electrode 28dd connected to the oxide semiconductor layer 18ts1 to face each other. Between the source electrode 28sd and the drain electrode 28dd, a channel region 18c is provided in the oxide semiconductor layer 18ts1. Here, the gate electrode 14gd, the gate insulating layer 16gi1, and the oxide semiconductor layer 18ts1 have side end faces formed to be flush with one another, thereby forming a multilayer structure 20a.

Each gate electrode 14gd is part of the gate line 14g1 forming corresponding one of the intersections, and includes, as illustrated in FIG. 3, protrusions 20ap protruding on both sides in the width direction of the gate line 14g1 together with the gate insulating layer 16gi1 and the oxide semiconductor layer 18ts1. Each gate electrode 14gd and corresponding one of the gate lines 14g1 are formed to be integral with each other by sequentially stacking, for example, an aluminum (Al) layer, a titanium (Ti) layer, and an indium zinc oxide (hereinafter referred to as IZO) layer. Moreover, the gate insulating layer 16gi1 is made of, for example, silicon dioxide ($SiO_2$). The oxide semiconductor layer 18ts1 is made of, for example, an indium-gallium-zinc oxide (hereinafter referred to as IGZO)-based oxide semiconductor.

The multilayer structure 20a is covered with a spin-on glass (hereinafter referred to as SOG) film 22 which is provided over substantially the entire surface of the insulating substrate 12, and is a stopper insulating film made of a SOG material containing, for example, silicon dioxide ($SiO_2$) as a main component. The SOG film 22 has a pair of contact holes 22ch formed in positions corresponding to the protrusions 20ap of the oxide semiconductor layer 18ts1 of each TFT 29 for connection to the oxide semiconductor layer 18ts1. Moreover, as illustrated in FIG. 3, the source electrode 28sd is a laterally protruding part of the source line 28s1 forming the corresponding one of the intersections. The source electrode 28sd is formed together with the source line 28s1 on the SOG film 22, and is connected to one side (upper side in FIG. 3) of the oxide semiconductor layer 18ts1 via one of the contact holes 22ch. On the other hand, the drain electrode 28dd is formed on the SOG film 22 in the same manner as the source electrode 28sd, and is connected to the other side (lower side in FIG. 3) of the oxide semiconductor layer 18ts1 via the other of the contact holes 22ch.

That is, in each TFT 29, the SOG film 22 is provided between (i) the source electrode 28sd and the drain electrode 28dd and (ii) the oxide semiconductor layer 18ts1 to cover the oxide semiconductor layer 18ts1 except for regions for connection to the source electrode 28sd and the drain electrode 28dd. Thus, the SOG film 22 serves as an etching stopper on the channel region 18c when the source electrode 28sd and the drain electrode 28dd are formed.

The source line 28s1, the source electrode 28sd, and the drain electrode 28dd include transparent conductive layers 26s, 26d and light shielding conductive layers 27s, 27d which are sequentially stacked. The transparent conductive layers 26s, 26d are made of, for example, indium tin oxide (hereinafter referred to as ITO). The light shielding conductive layers 27s, 27d includes, for example, a titanium (Ti) layer, an aluminum (Al) layer, and a titanium (Ti) layer which are sequentially stacked.

The TFTs 29 are covered with a protective insulating film 30 made of, for example, silicon dioxide ($SiO_2$) or silicon nitride (SiN). This prevents entry of moisture, oxygen, etc., thereby reducing characteristic degradation of the TFTs. The protective insulating film 30 is provided over substantially the entire surface of the TFT substrate 10. In the display area D, the protective insulating film 30 is formed along the gate lines 14g1 and the source lines 28s1 to have a lattice pattern, and has openings 30a formed in positions corresponding to the pixel electrodes 26pd. Moreover, the light shielding conductive layer 27d of the drain electrode 28dd of the TFT 29 has an end face facing the pixel electrode 26pd, where the end face matches an inner surface of the opening 30a in the protective insulating film 30. The pixel electrode 26pd is made of a film identical to a film forming the transparent conductive layer 26d of the drain electrode 28dd.

As illustrated in FIG. 3, the protective insulating film 30 has terminal section exposing holes 30th formed in positions each corresponding to an end portion of the source line 28s1. In the terminal section exposing holes 30th, the end portions of the source lines 28s1 are exposed to the outside, thereby forming the terminal sections 28st.

Moreover, an insulating layer 16i1 made of a film identical to a film forming the gate insulating layer 16gi1 and an oxide semiconductor layer 18s1 are sequentially stacked on the gate line 14g1, thereby forming a multilayer structure which is connected to and integral with the multilayer structure 20a of the TFT 29. The multilayer structure is also covered with the SOG film 22.

The SOG film 22 has channel isolation holes 22sh formed in positions each of which is located between adjacent two of the TFTs 29 connected to a common one of the gate lines 14g1, and corresponds to the common gate line 14g1. As illustrated in FIG. 4 (cross-section B-B), the oxide semiconductor layer 18ts1 of the adjacent TFTs 29 is divided in the channel isolation hole 22sh to isolate the channel regions 18c of the TFTs 29 from each other. The channel isolation holes 22sh are formed on both sides of each TFT 29, and each have an overall size that fits within part of the position corresponding to the gate line 14g1 except for the gate electrode 14gd.

As illustrated in FIG. 4 (cross-section D-D), the SOG film 22 further has first terminal section exposing holes 22th formed in positions each corresponding to an end portion of the gate line 14g1. Second terminal section exposing holes 32 are formed in the protective insulating film 30 and the insulating layer 16i1 within the first terminal section exposing holes 22th. In the second terminal section exposing holes 32, the end portions of gate lines 14g1 are exposed to the outside, thereby forming the terminal sections 14gt.

As illustrated in FIG. 4 (cross-section C-C), the insulating layer 16i1 made of the film identical to the film forming the gate insulating layer 16gi1 and the oxide semiconductor layer 18s1 are sequentially stacked on the storage capacitor line 14h1, thereby forming a multilayer structure 20b similar to the multilayer structure 20a of the TFT 29.

The SOG film 22 has storage capacitor formation holes 22hh formed in positions each corresponding to the storage capacitor line 14h1 of the pixel. Part of the pixel electrode 26pd overlaps the oxide semiconductor layer 18s1 in the storage capacitor formation hole 22hh. The part of the pixel electrode 26pd and a storage capacitor electrode 14hd which is part of the storage capacitor line 14h1 sandwich the insulating layer 16i1 and the oxide semiconductor layer 18s1 as a dielectric layer. This structure forms a storage capacitor element 31.

Although not shown in the figure, the counter substrate 50 includes a black matrix provided above the insulating substrate serving as a base substrate to form a lattice pattern corresponding to the gate lines 14g1 and the source lines 28s1, a multicolor filter which includes red, green, and blue layers cyclically aligned between the grid lines of the black matrix, a common electrode provided to cover the black matrix and the color filter, and a columnar photo spacer provided on the common electrode.

In each pixel of the liquid crystal display device S having the configuration described above, when a gate signal is sent from the gate driver IC chip 53 to the gate electrode 14gd via the gate line 14g1 to turn on the TFT 29, a source signal is sent from the source driver IC chip 54 to the source electrode 28sd via the source line 28s1, and predetermined charge is injected into the pixel electrode 26pd via the oxide semiconductor layer 18s1 and the drain electrode 2dd, and charge corresponding to the predetermined charge is injected into the storage capacitor element 31. Here, a potential difference appears between each pixel electrode 26pd of the TFT substrate 10 and the common electrode of the counter substrate 50, and a predetermined voltage is applied to the liquid crystal layer 51. Moreover, when each TFT 29 is in an off state, storage capacitance formed in the storage capacitor element 31 limits a reduction in the voltage injected into the corresponding one of the pixel electrodes 26pd to a lesser degree. In each pixel in the liquid crystal display device S, alignment of liquid crystal molecules is changed according to the level of a voltage applied to the liquid crystal layer 51, thereby adjusting light transmittance of the liquid crystal layer 51 to display an image.

—Fabrication Method—

Figure 5:
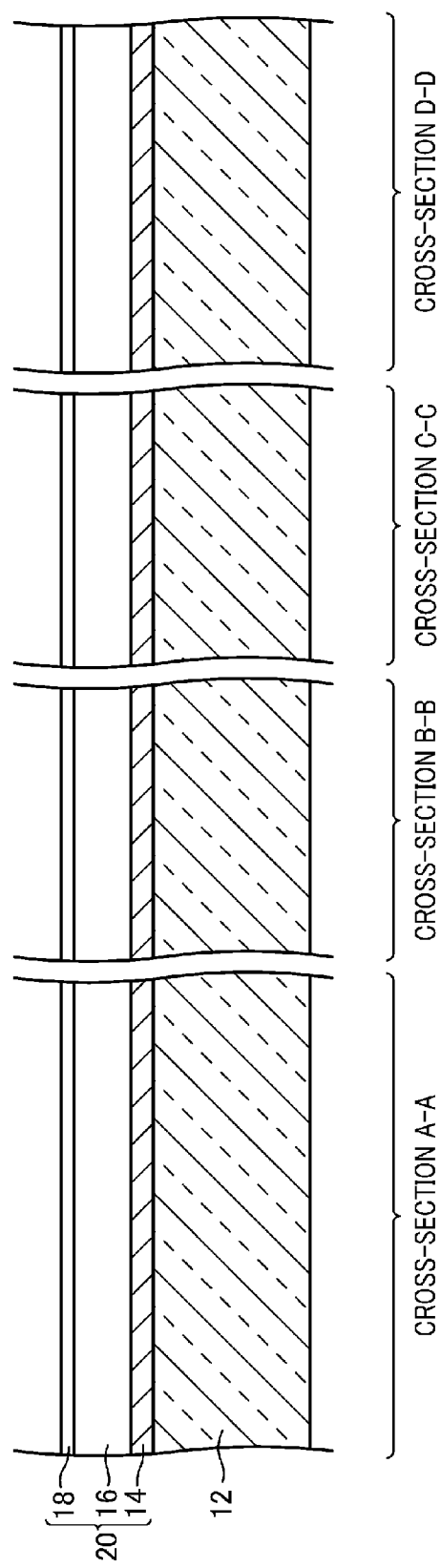
FIG. 5 is a cross-sectional view illustrating portions corresponding to FIG. 4, where a multilayer film, which will be formed into gate electrodes, storage capacitor elements, and the like, is formed in a first patterning step of the first embodiment.
Figure 6:
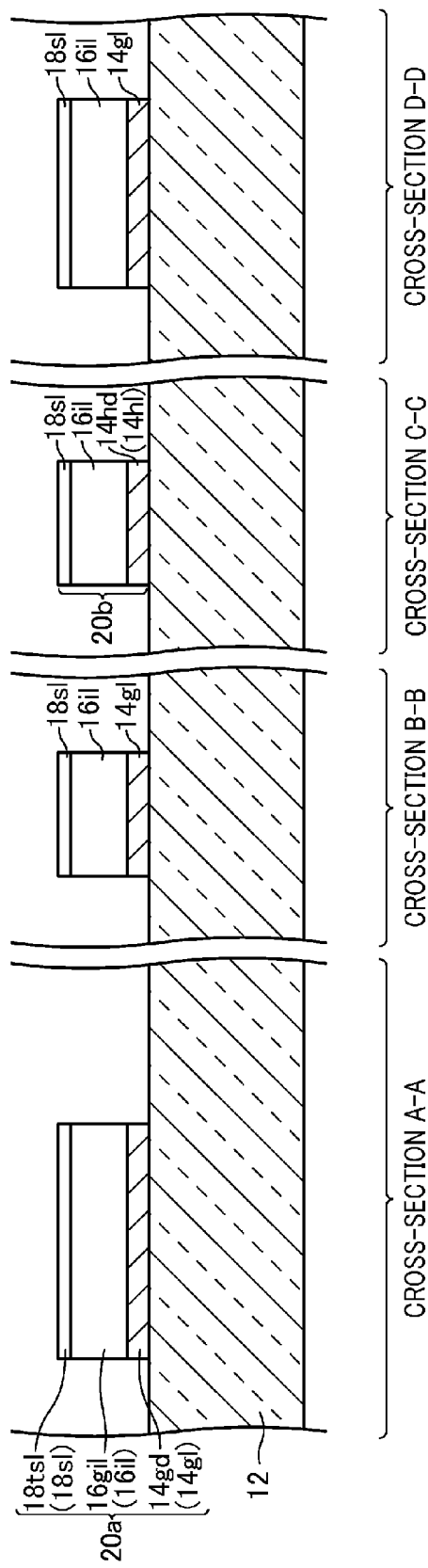
FIG. 6 is a cross-sectional view illustrating the portions corresponding to FIG. 4, where a multilayer structure is formed from the multilayer film in the first patterning step of the first embodiment.
Figure 7:
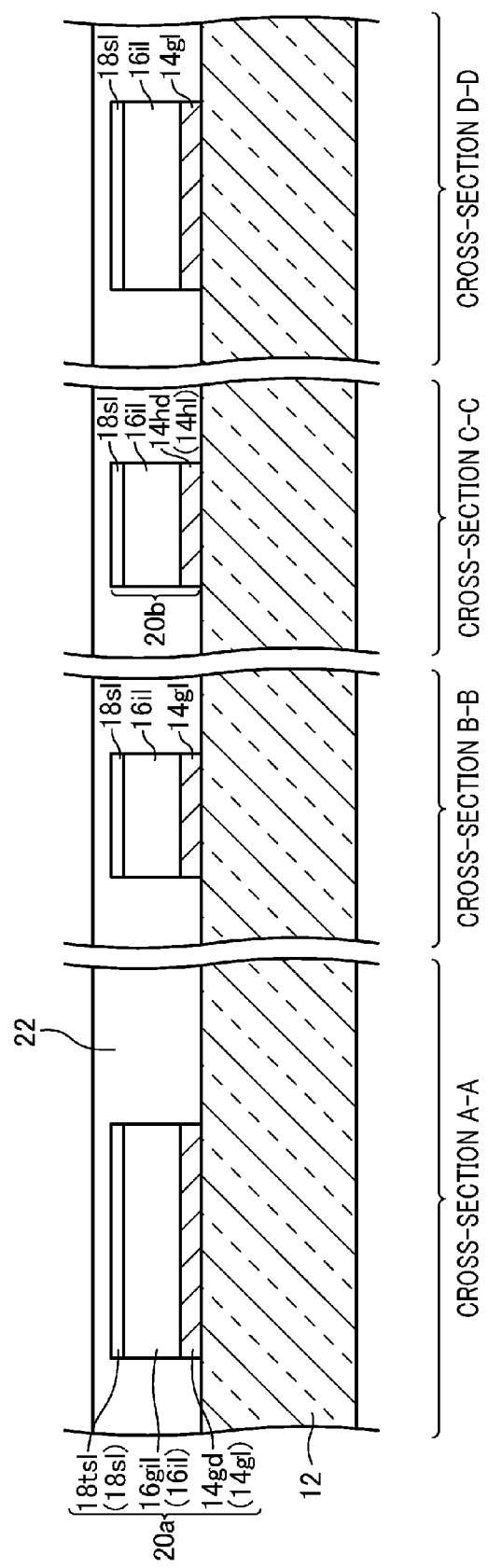
FIG. 7 is a cross-sectional view illustrating the portions corresponding to FIG. 4, where a SOG film is formed in a second patterning step of the first invention.
Figure 8:
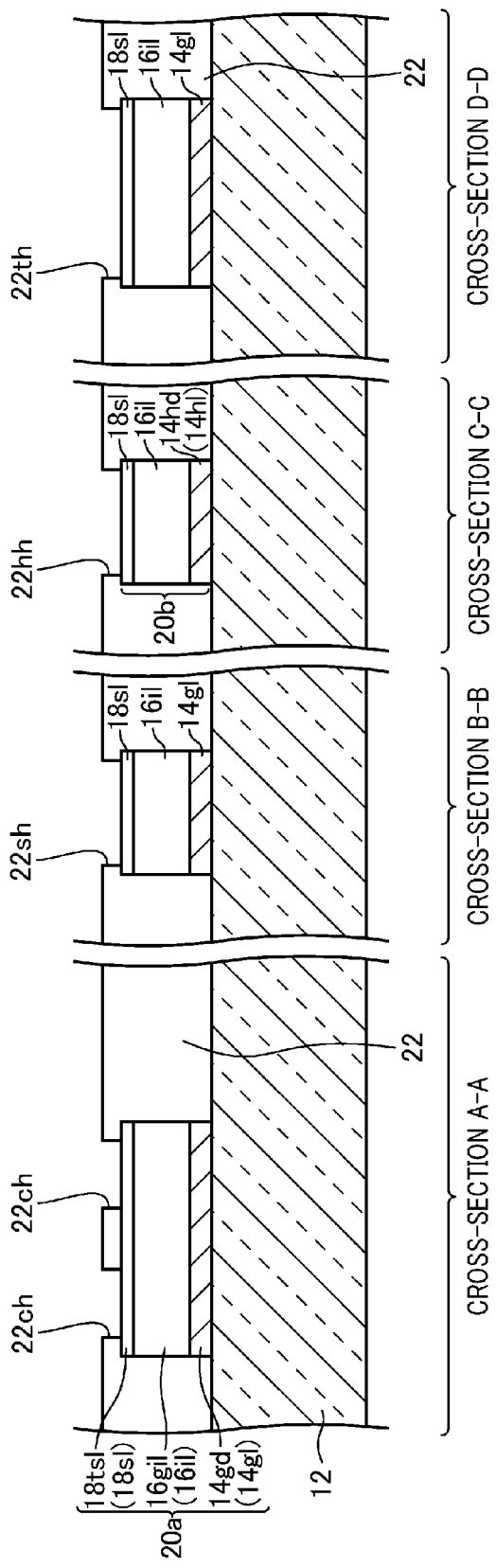
FIG. 8 is a cross-sectional view illustrating the portions corresponding to FIG. 4, where contact holes and various holes are formed in the SOG film in the second patterning step of the first embodiment.
Figure 9:
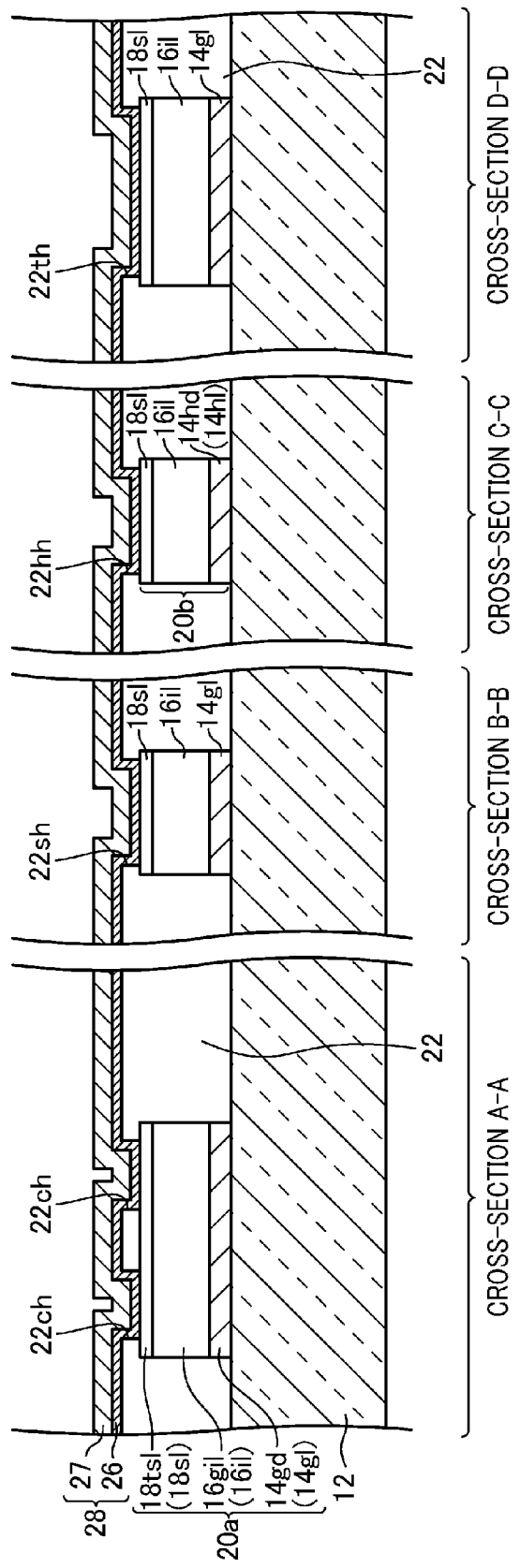
FIG. 9 is a cross-sectional view illustrating the portions corresponding to FIG. 4, where a multilayer conductive film, which will be formed into source electrodes and drain electrodes, is formed in a third patterning step of the first embodiment.
Figure 10:
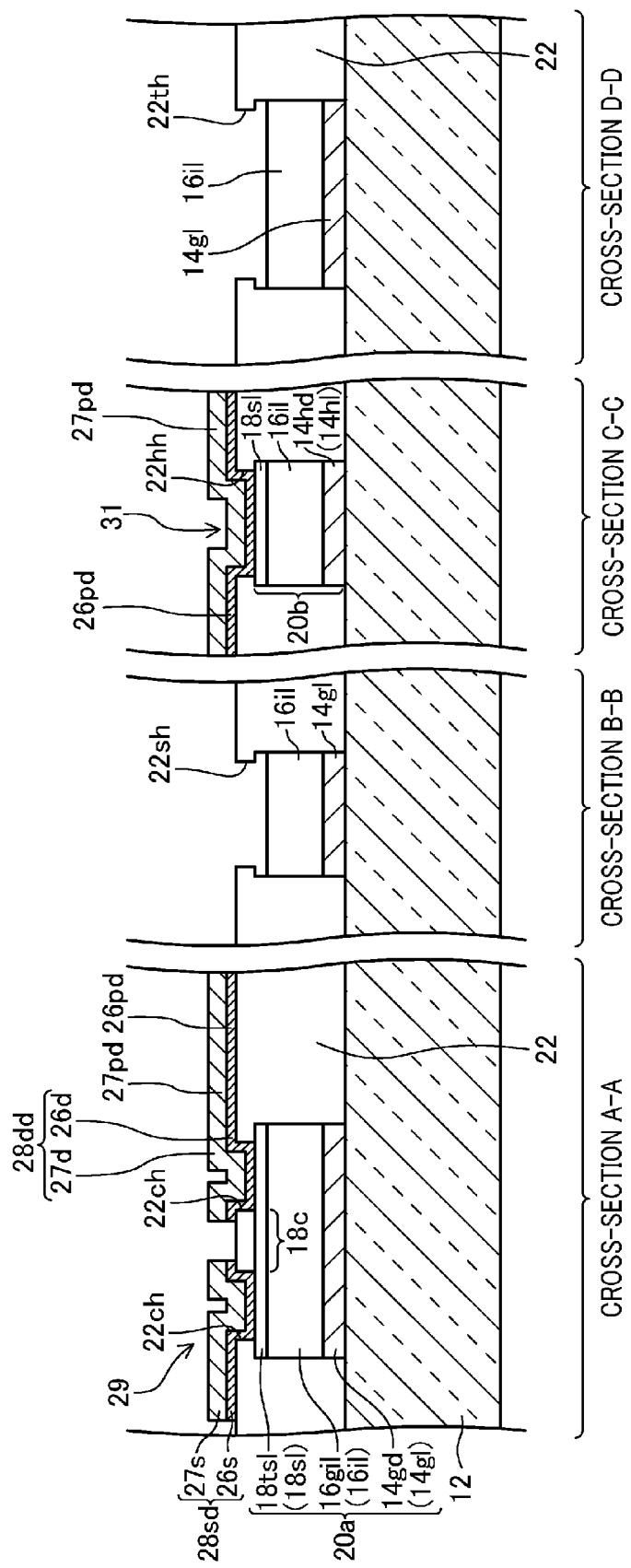
FIG. 10 is a cross-sectional view illustrating the portions corresponding to FIG. 4, where the source electrodes, the drain electrodes, and pixel electrodes on which a light shielding conductive layer is stacked are formed in the third patterning step of the first embodiment.
Figure 11:
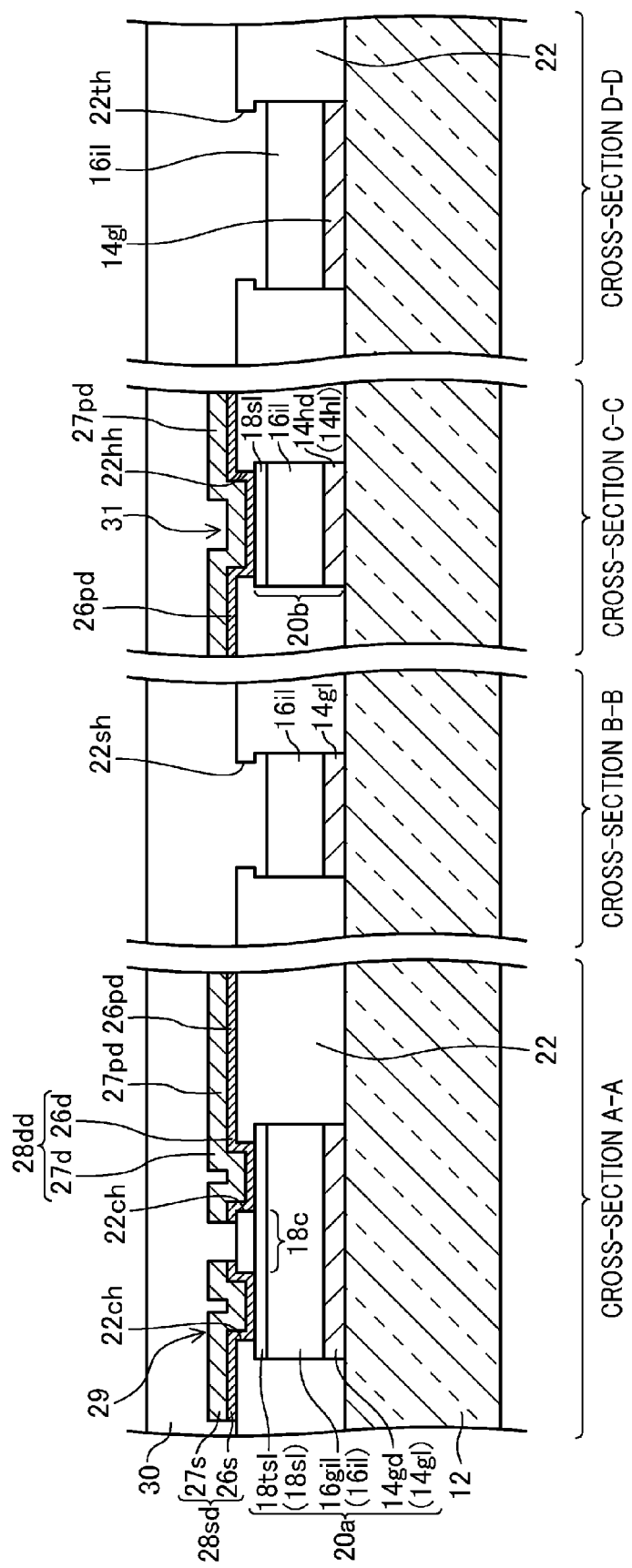
FIG. 11 is a cross-sectional view illustrating the portions corresponding to FIG. 4, wherein a protective insulating film is formed in a fourth patterning step of the first embodiment.
Figure 12:
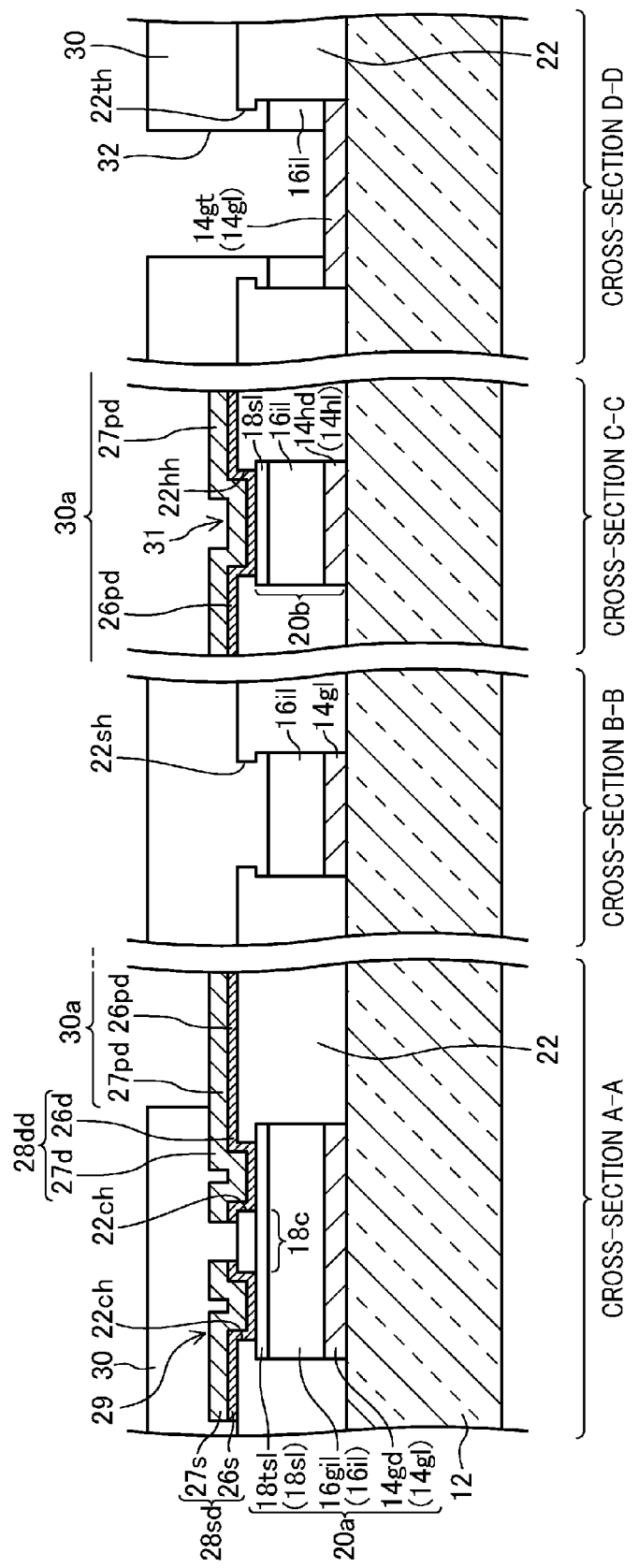
FIG. 12 is a cross-sectional view illustrating the portions corresponding to FIG. 4, where in the fourth patterning step of the first embodiment, in the protective insulating film, openings are formed in positions each corresponding the pixel electrode, and in an insulating layer and the protective insulating film, second terminal section exposing holes are formed in positions each corresponding to an end portion of the gate line.

Next, an example method for fabricating the TFT substrate 10 and the liquid crystal display device S will be described with reference to FIGS. 5-12. FIG. 5 and FIG. 6 are cross-sectional view illustrating a first patterning step in the method for fabricating the TFT substrate 10. FIG. 7 and FIG. 8 are cross-sectional views illustrating a second patterning step in the method for fabricating the TFT substrate 10. FIG. 9 and FIG. 10 are cross-sectional views illustrating a third patterning step in the method for fabricating the TFT substrate 10. FIG. 11 and FIG. 12 are cross-sectional views illustrating a fourth patterning step in the method for fabricating the TFT substrate 10. Note that FIGS. 5-12 illustrate portions corresponding to FIG. 4.

The method for fabricating the liquid crystal display device S of the present embodiment includes a TFT substrate formation step, a counter substrate formation step, a bonding step, and a mounting step.

<TFT Substrate Formation Step>

The TFT substrate formation step includes first to fourth patterning steps.

<First Patterning Step>

First, on a prepared insulating substrate 12 such as a glass substrate, for example, an aluminum film, a titanium film, and an IZO film are sequentially formed by sputtering, thereby forming a metal multilayer film 14 serving as a first conductive film. Subsequently, on the metal multilayer film 14, a first insulating film 16 such as a silicon dioxide film is formed by plasma CVD. Subsequently, on the first insulating film 16, an IGZO-based oxide semiconductor film 18 is further formed by sputtering, thereby forming a multilayer film 20 as illustrated in FIG. 5. Then, the multilayer film 20 is patterned by photolithography using a first photomask.

That is, photosensitive resin is applied to the multilayer film 20, and a film made of the applied photosensitive resin is exposed to light via the first photomask, and then developed to perform patterning, thereby forming a resist pattern on the multilayer film 20 in positions in which gate lines 14g1, gate electrodes 14gd, and storage capacitor lines 14h 1 will be formed. Subsequently, using the resist pattern as a mask, the oxide semiconductor film 18 is patterned by etching with, for example, an oxalic acid solution, thereby forming an oxide semiconductor layer 18s1.

Next, using the resist pattern and the oxide semiconductor layer 18s1 as a mask, the first insulating film 16 is patterned by reactive ion etching (hereinafter referred to as RIE) using, for example, fluorine-based gas, thereby forming an insulating layer 16i1.

Further, by using the resist pattern, the oxide semiconductor layer 18s1, and the insulating layer 16i1 as a mask, the IZO film of the metal multilayer film 14 is etched by RIE using, for example, a mixed solution of phosphoric acid, acetic acid, and nitric acid. Subsequently, the other films of the metal multilayer film 14, that is, the titanium film and the aluminum film are etched by RIE using, for example, chlorine-based gas, thereby patterning the metal multilayer film 14. Thereafter, the resist pattern is removed by cleaning with a resist remover solution. The gate lines 14g1, the gate electrodes 14gd, and the storage capacitor lines 14h 1 are thus formed.

Thus, as illustrated in FIG. 6, multilayer structures 20a, 20b are formed, wherein the multilayer structure 20a includes the gate line 14g1, the gate electrode 14gd, and the insulating layer 16i1 and the oxide semiconductor layer 18s1 which are sequentially stacked on the gate line 14g1 and the gate electrode 14gd, and the multilayer structure 20b includes the storage capacitor lines 14h 1, and the insulating layer 16i1 and the oxide semiconductor layer 18s1 which are sequentially stacked on the storage capacitor lines 14h 1. In the thus formed multilayer structure 20a, part of the insulating layer 16i1 corresponding to the gate electrode 14gd forms a gate insulating layer 16gi1, and part of the oxide semiconductor layer 18s1 corresponding to the gate electrode 14gd forms an oxide semiconductor layer 18ts1 of a TFT 29.

<Second Patterning Step>

A SOG material containing, for example, silicon dioxide as a main component is applied to the substrate provided with the multilayer structures 20a, 20b by spin coating or slit coating, and then is baked at a temperature of 350° C., thereby forming a SOG film 22 serving as a second insulating film as illustrated in FIG. 7. The SOG film 22 as the second insulating film is formed by coating, and thus, unlike the case where the second insulating film is formed by plasma CVD, a channel region 18c of the oxide semiconductor layer 18ts1 of the TFT 29 is not subjected to plasma. Thus, it is possible to reduce damage to the channel region 18c of the oxide semiconductor layer 18ts1.

Then, on the SOG film 22 except for positions in which contact holes 22ch, and various holes 22sh, 22hh, 22th will be formed, a resist pattern is formed by using a second photomask. By using the resist pattern as a mask, the SOG film 22 is patterned by RIE using, for example, fluorine-based gas. After that, the resist pattern is removed by cleaning with a resist remover solution. In this way, as illustrated in FIG. 8, in the SOG film 22, a pair of contact holes 22ch extending to the oxide semiconductor layer 18ts1 is formed in positions corresponding to each gate electrode 14gd, channel isolation holes 22sh extending to the oxide semiconductor layer 18s1 are formed in positions each of which is located between adjacent two of the gate electrodes 14gd connected to a common one of the gate lines 14g1, and corresponds to the common gate line 14g1, storage capacitor formation holes 22hh extending to the oxide semiconductor layer 18s1 are formed in positions each corresponding to the storage capacitor line 14h 1, and first terminal section exposing holes 22th are formed in positions each corresponding to an end portion of the gate line 14g1, so that the SOG film 22 serves as a stopper insulating film. Here, since the oxide semiconductor layers 18s1, 18ts1 serve as etching stoppers, etching is stopped when the contact holes 22ch and the various holes 22sh, 22hh, 22th reach the oxide semiconductor layers 18s1, 18ts1. Thus, even when etching to form the contact holes 22ch and the various holes 22sh, 22hh, 22th is not controlled at a fine level, damage to the gate line 14g1 by the etching is reduced, and the contact holes 22ch and the various holes 22sh, 22hh, 22th can easily be formed.

<Third Patterning Step>

Above the substrate provided with the SOG film 22, a transparent conductive film 26 such as an ITO film is formed by sputtering. Subsequently, on the transparent conductive film 26, for example, a titanium film, an aluminum film, and a titanium film are sequentially formed by sputtering, thereby forming a light-shielding conductive film 27. Thus, as illustrated in FIG. 9, a multilayer conductive film 28 serving as a second conductive film in which the transparent conductive film 26 and the light-shielding conductive film 27 are sequentially stacked is formed.

Next, on the multilayer conductive film 28, a resist pattern is formed by using a third photomask in positions in which source lines 28s1, source electrodes 28sd, drain electrodes 28dd, and pixel electrodes 26pd will be formed. Then, by using the resist pattern as a mask, the light-shielding conductive film 27 (the titanium film, the aluminum film, and the titanium film) is etched by RIE using, for example, chlorine-based gas. Subsequently, the transparent conductive film 26 is etched with, for example, an oxalic acid solution, thereby patterning the multilayer conductive film 28. After that, the resist pattern is removed by cleaning with a resist remover solution. In this way, as illustrated in FIG. 10 (cross-section A-A), the source line 28s1, the source electrode 28sd, and the drain electrode 28dd are formed, thereby forming the TFT 29, and the pixel electrode 26pd provided with the light shielding conductive layer 27pd is formed. Here, the SOG film 22 serves as an etching stopper on the channel region 18c, and thus the channel region 18c is not damaged by the etching.

Moreover, simultaneously with patterning the transparent conductive film 26, as illustrated in FIG. 10 (cross-section B-B), the oxide semiconductor layer 18s1 is divided by removing part of the oxide semiconductor layer 18s1 located in a position corresponding to the gate line 14g1 in the channel isolation hole 22sh. Thus, parts of the oxide semiconductor layer 18ts1 which are located above the adjacent gate electrodes 14gd connected to the common gate line 14g1 are isolated from each other. Moreover, as illustrated in FIG. 10 (cross-section D-D), part of the oxide semiconductor layer 18s1 is removed in the first terminal section exposing hole 22th to expose the insulating layer 16i1.

<Fourth Patterning Step>

As illustrated in FIG. 11, a protective insulating film 30 made of, for example, silicon dioxide is formed by plasma CVD on the substrate provided with the source lines 28s1, the source electrodes 28sd, the drain electrodes 28dd, and the pixel electrodes 26pd provided with the light shielding conductive layer 27pd. Here, the channel region 18c of the oxide semiconductor layer 18ts1 of each TFT 29 is covered and protected with the SOG film 22, and thus is not damaged by plasma in forming the protective insulating film 30.

Then, by using a fourth photomask, a resist pattern is formed on the protective insulating film 30 except for positions corresponding to the pixel electrodes 26pd, end portions of the source lines 28s1, and the first terminal section exposing holes 22th. Then, by using the resist pattern as a mask, the protective insulating film 30 is patterned by RIE using, for example, fluorine-based gas. In this way, as illustrated in FIG. 12, in the protective insulating film 30, openings 30a are formed in positions each corresponding to the pixel electrode 26pd, and terminal section exposing holes 30th are formed in positions each corresponding to the end portion of the source line 28s1. Moreover, in the protective insulating film 30 and the insulating layer 16i1, second terminal section exposing holes 32 are formed in positions each corresponding to the first terminal section exposing hole 22th. The end portions of the source lines 28s1 are exposed from the terminal section exposing holes 30th to the outside, thereby forming source terminal sections 28st. The end portions of the gate lines 14g1 are exposed from the second terminal section exposing holes 32 to the outside, thereby forming gate terminal sections 14gt.

Subsequently, by using the resist pattern and the protective insulating film 30 as a mask, the light shielding conductive layer 27pd on the pixel electrodes 26pd is removed by RIE using, for example, chlorine-based gas in the openings 30a in the protective insulating film 30. After that, the resist pattern is removed by cleaning with a resist remover solution. Thus, the pixel electrodes 26pd each including only a transparent conductive layer are exposed to the outside.

The TFT substrate 10 can thus be formed.

<Counter Substrate Formation Step>

First, negative acrylic photosensitive resin in which particles of, for example, carbon are dispersed is applied to the entire surface of an insulating substrate such as a glass substrate by spin coating or slit coating, and a film made of the applied photosensitive resin is exposed to light via a photomask, and then developed to perform patterning, thereby forming a black matrix.

Subsequently, negative acrylic photosensitive resin colored, for example, red, green, or blue is applied to the substrate provided with the black matrix, and a film made of the applied photosensitive resin is exposed to light via a photomask, and then developed to perform patterning, thereby forming a layer colored a selected color (e.g., a red layer). Further, layers colored the other two colors (e.g., green and blue layers) are also formed by repeating a similar process, thereby forming a color filter.

Next, on the substrate provided with the color filter, for example, an ITO film is formed by sputtering, thereby forming a common electrode. Then, positive phenol novolac photosensitive resin is applied to the substrate provided with the common electrode by spin coating, and a film made of the applied photosensitive resin is exposed to light via a photomask, and then is developed, thereby forming a photo spacer.

The counter substrate 50 can thus be formed.

<Bonding Step>

First, polyimide-based resin is applied to a surface of the TFT substrate 10 by printing, and then a rubbing process is performed as needed, thereby forming an alignment layer 55. Polyimide-based resin is also applied to a surface of the counter substrate 50 by printing, and then a rubbing process is performed as needed, thereby forming an alignment layer 56.

Next, on the counter substrate 50 provided with the alignment layer 56, a sealing material 52 made of, for example, ultraviolet and thermal curing resin is formed to have a rectangular frame shape by using, for example, a dispenser. Subsequently, a predetermined amount of a liquid crystal material is dropped into an inner region surrounded by the sealing material 52 formed on the counter substrate 50.

Then, the counter substrate 50 on which the liquid crystal material has been dropped is bonded to the TFT substrate 10 provided with the alignment layer 55 under reduced pressure, and the bonded assembly is released to the atmospheric pressure, thereby pressurizing the surface of the bonded assembly. Then, the sealing material 52 of the bonded assembly is irradiated with ultra violet (UV) light so that the sealing material 52 is precured. After that, the bonded assembly is heated so that the sealing material 52 is postcured, thereby bonding the TFT substrate 10 to the counter substrate 50.

After that, polarizing plates 57, 58 are respectively attached to an outer surface of the TFT substrate 10 and an outer surface of the counter substrate 50 which are bonded together.

<Mounting Step>

An ACF is arranged on the terminal area 10a of the bonded assembly on opposite surfaces of which the polarizing plates 57, 58 have been attached. Then, the gate driver IC chips 53 and the source driver IC chips 54 are bonded to the terminal area 10a by thermocompression with the ACF interposed between the terminal area 10a and the gate driver IC chips 53 and between the terminal area 10a and the source driver IC chips 54, thereby mounting the driver IC chips 53, 54 on the bonded assembly.

Through the foregoing steps, the liquid crystal display device S can be fabricated.

Advantages of First Embodiment

In the first embodiment, each TFT 29 has such a configuration that the SOG film 22 serves as an etching stopper when the source electrode 28sd and the drain electrode 28dd are formed. Thus, when the source electrode 28sd and the drain electrode 28dd are formed, the SOG film 22 protects the channel region 18c of the oxide semiconductor layer 18ts1. Therefore, the channel region 18c is not damaged by etching, so that it is possible to obtain a TFT 29 having satisfactory characteristics. Moreover, the TFT substrate 10 having the configuration of the first embodiment can be formed by using a total of four photomasks as described in the TFT substrate formation step. Thus, it is possible to obtain a TFT 29 having satisfactory characteristics by using an oxide semiconductor, and to form a TFT substrate 10 including the TFT 29 at low cost with the number of photomasks being reduced. As a result, display quality can be improved while cost of the liquid crystal display device S itself is reduced.

Second Embodiment of Invention

Figure 13:
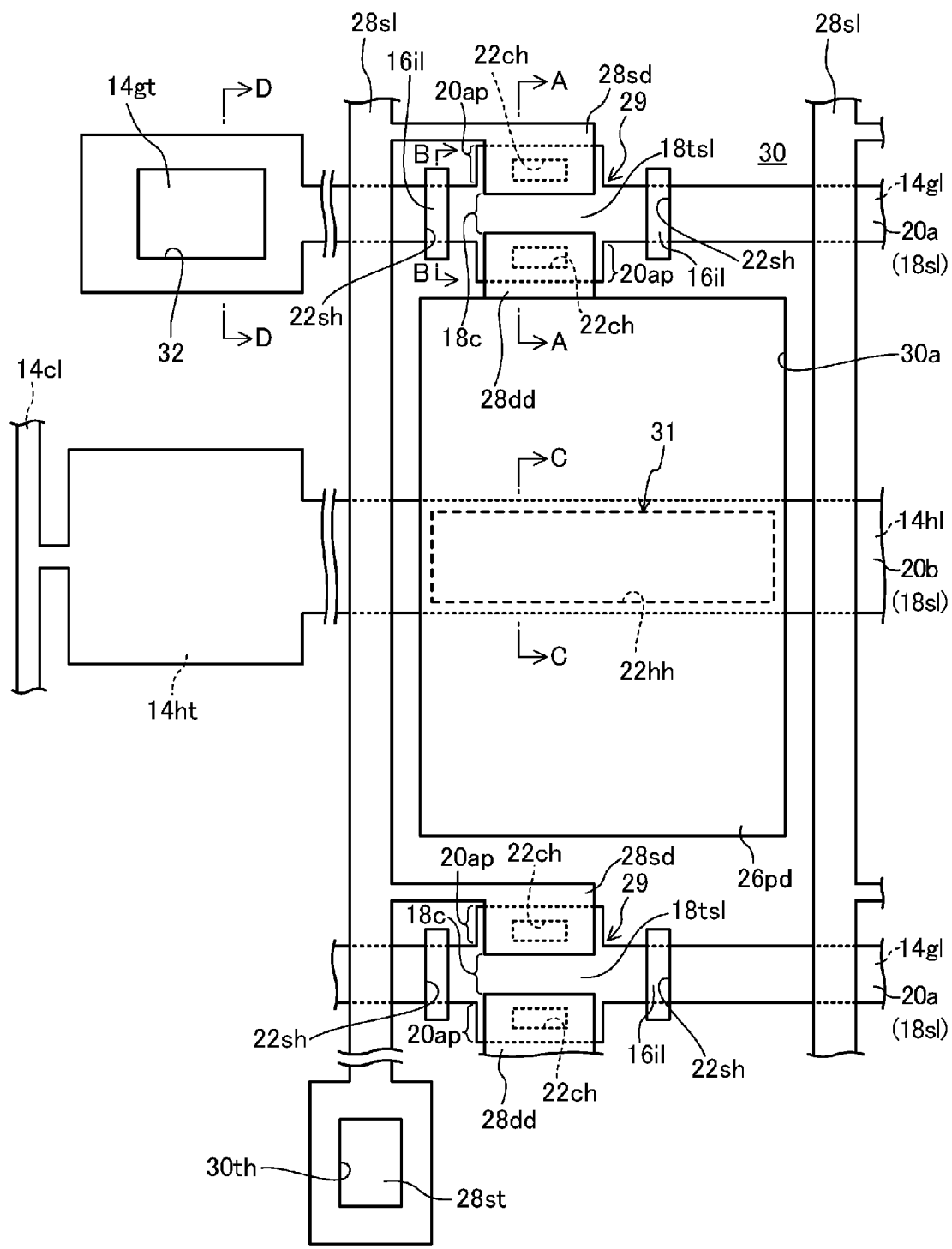
FIG. 13 is a plan view schematically illustrating one pixel and terminal sections of a TFT substrate of a second embodiment.
Figure 14:
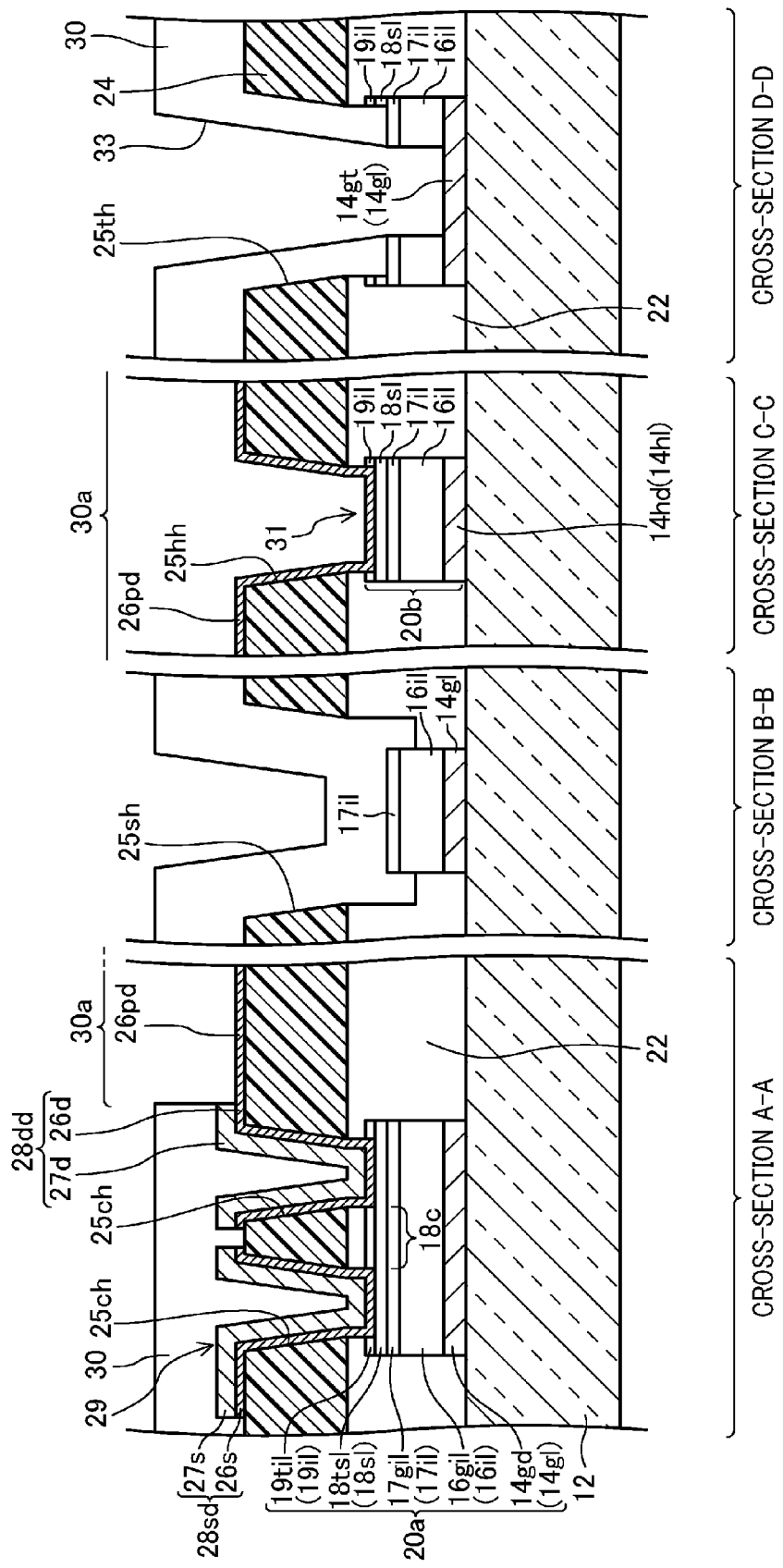
FIG. 14 is a cross-sectional view illustrating the cross-sectional structures along the line A-A, B-B, C-C, and D-D of FIG. 13.

FIG. 13 is a plan view schematically illustrating a configuration of one pixel and terminal sections of a TFT substrate 10 according to a second embodiment. FIG. 14 is a cross-sectional view in which cross-sectional structures along the lines A-A, B-B, C-C, and D-D of FIG. 13 are shown from the left. The present embodiment has the same configuration as the first embodiment except that the configuration of the TFT substrate 10 is different from that of the first embodiment. Thus, only the TFT substrate 10, the configuration of which is different from that of the first embodiment, will be described. Note that in the following embodiments, the same reference numerals as those shown in FIGS. 1-12 are used to represent equivalent elements, and the detailed explanation thereof will be omitted.

Gate lines 14g1, gate electrodes 14gd, and storage capacitor lines 14h 1 of the TFT substrate 10 of the present embodiment are formed by sequentially stacking, for example, an aluminum (Al) layer, a molybdenum nitride (MoN) layer, and an IZO layer. As illustrated in FIG. 14 (cross-section A-A, cross-section C-C), a first insulating layer 16i1 and a second insulating layer 17i1 are sequentially stacked on the gate line 14g1 and the storage capacitor line 14h 1, and the first insulating layer 16i1 and the second insulating layer 17i1 forms an insulating layer of the present invention.

That is, a first gate insulating layer 16gi1 and a second gate insulating layer 17gi1 are sequentially stacked also on the gate electrode 14gd, and both the gate insulating layers 16gi1, 17gi1 forms a gate insulating layer of the present invention. Moreover, the first insulating layer 16i1 and the second insulating layer 17i1 are sequentially stacked also on a storage capacitor electrode 14hd, and both the insulating layers 16i1, 17i1 and an oxide semiconductor layer 18s1 forms a dielectric layer of a storage capacitor element 31. Thus, the gate insulating layer has a two-layered structure, and the dielectric layer of the storage capacitor element 31 has a three-layered structure. The first gate insulating layer 16gi1 and the first insulating layer 16i1 are made of, for example, silicon nitride (SiN). The second gate insulating layer 17gi1 and the second insulating layer 17i1 are made of, for example, silicon dioxide ($SiO_2$).

Moreover, a third insulating layer 19ti1 is stacked on an oxide semiconductor layer 18ts1 of each of TFTs 29 to cover a region except for positions in which a source electrode 28sd and a drain electrode 28dd are connected to the oxide semiconductor layer 18ts1. Moreover, a third insulating layer 19i1 is stacked on the oxide semiconductor layer 18s1 in a position corresponding to the gate line 14g1. A SOG film 22 is formed to cover a multilayer structure 20a which includes the gate line 14g1 and the gate electrode 14gd, and the first gate insulating layer 16gi1, the second gate insulating layer 17gi1, the oxide semiconductor layer 18ts1, and the third insulating layer 19ti1 which are sequentially stacked on the gate line 14g1 and the gate electrode 14gd, and a multilayer structure 20b which includes the storage capacitor line 14h 1, and the first insulating layer 16i1, the second insulating layer 17i1, the oxide semiconductor layer 18s1, and the third insulating layer 19i1 which are sequentially stacked on the storage capacitor line 14h 1. A transparent resin insulating film 24 is formed over substantially the entire surface of the SOG film 22.

In the third insulating layer 19ti1, the SOG film 22, and the transparent resin insulating film 24, a pair of contact holes 25ch for connection to the oxide semiconductor layer 18ts1 is formed in positions corresponding to protrusions 20ap of the oxide semiconductor layer 18ts1 of each TFT 29. The source electrode 28sd and the drain electrode 28dd formed on the transparent resin insulating film 24 are connected to the oxide semiconductor layer 18ts1 via the contact holes 25ch. That is, in the present embodiment, the third insulating layer 19ti1, the SOG film 22, and the transparent resin insulating film 24 form a stopper insulating film of the present invention, and serve as an etching stopper on each of channel regions 18c when the source electrode 28sd and the drain electrode 28dd are formed.

Similar to the first embodiment, the source electrodes 28sd, the drain electrodes 28dd, and source lines 28s1 formed on the transparent resin insulating film 24 together with the source electrodes 28sd and the drain electrodes 28dd include transparent conductive layers 26s, 26d made of, for example, ITO, and light shielding conductive layers 27s, 27d which are sequentially stacked. The light shielding conductive layers 27s, 27d are formed by stacking, for example, a molybdenum nitride (MoN) layer, an aluminum (Al) layer, and a molybdenum nitride (MoN) layer.

As illustrated in FIG. 14 (cross-section B-B), channel isolation holes 25sh corresponding to the channel isolation holes 22sh of the first embodiment are further formed in the SOG film 22 and the transparent resin insulating film 24. As illustrated in FIG. 13, each channel isolation hole 25sh is formed in the SOG film 22 and the transparent resin insulating film 24 in a position corresponding to the gate line 14g1, and extends across the gate line 14g1 in the width direction of the gate line 14g1. Thus, the channel isolation hole 25sh has a larger width than the channel isolation hole 22sh of the first embodiment.

Moreover, as illustrated in FIG. 14 (cross-section C-C), in the third insulating layer 19i1, the SOG film 22, and the transparent resin insulating film 24, storage capacitor formation holes 25hh corresponding to the storage capacitor formation holes 22hh of the first embodiment are formed in positions each corresponding to the storage capacitor line 14h 1 of the pixel. Furthermore, as illustrated in FIG. 14 (cross-section D-D), in the oxide semiconductor layer 18s1, the third insulating layer 19i1, the SOG film 22, and the transparent resin insulating film 24, the first terminal section exposing holes 25th corresponding to the first terminal section exposing holes 22th of the first embodiment are formed in positions each corresponding to an end portion of the gate line 14g1. The first insulating layer 16i1, the second insulating layer 17i1, and a protective insulating film 30 have second terminal section exposing holes 33 each bored to be within the first terminal section exposing hole 25th. In the second terminal section exposing holes 33, the end portions of the gate lines 14g1 are exposed to the outside, thereby forming gate terminal sections 14gt.

—Fabrication Method—

Figure 15:
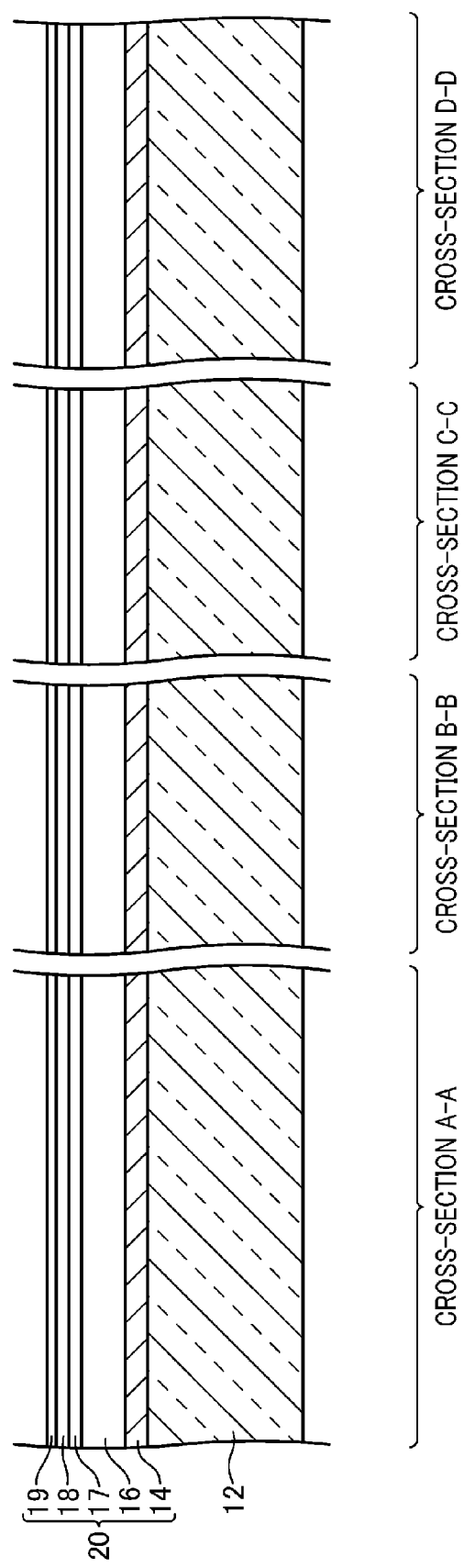
FIG. 15 is a cross-sectional view illustrating portions corresponding to FIG. 14, where a multilayer film, which will be formed into gate electrodes, storage capacitor elements, and the like, is formed in a first patterning step of the second embodiment.
Figure 16:
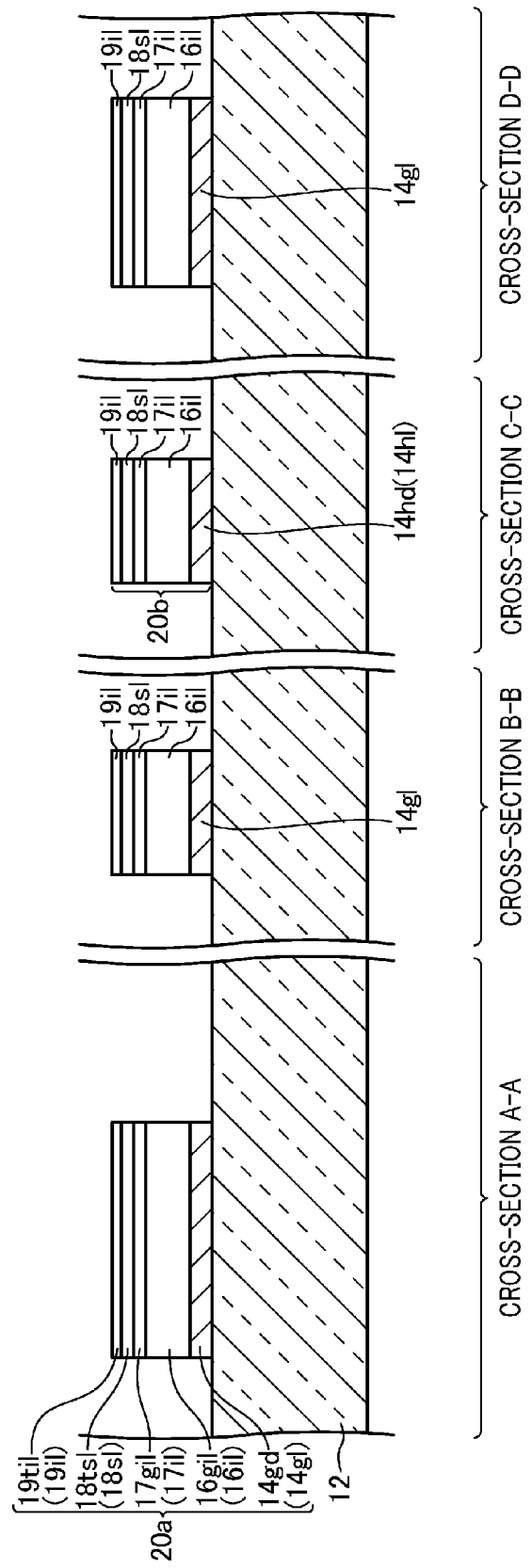
FIG. 16 is a cross-sectional view illustrating the portions corresponding to FIG. 14, wherein a multilayer structure is formed from the multilayer film in a first patterning step of the second embodiment.
Figure 17:
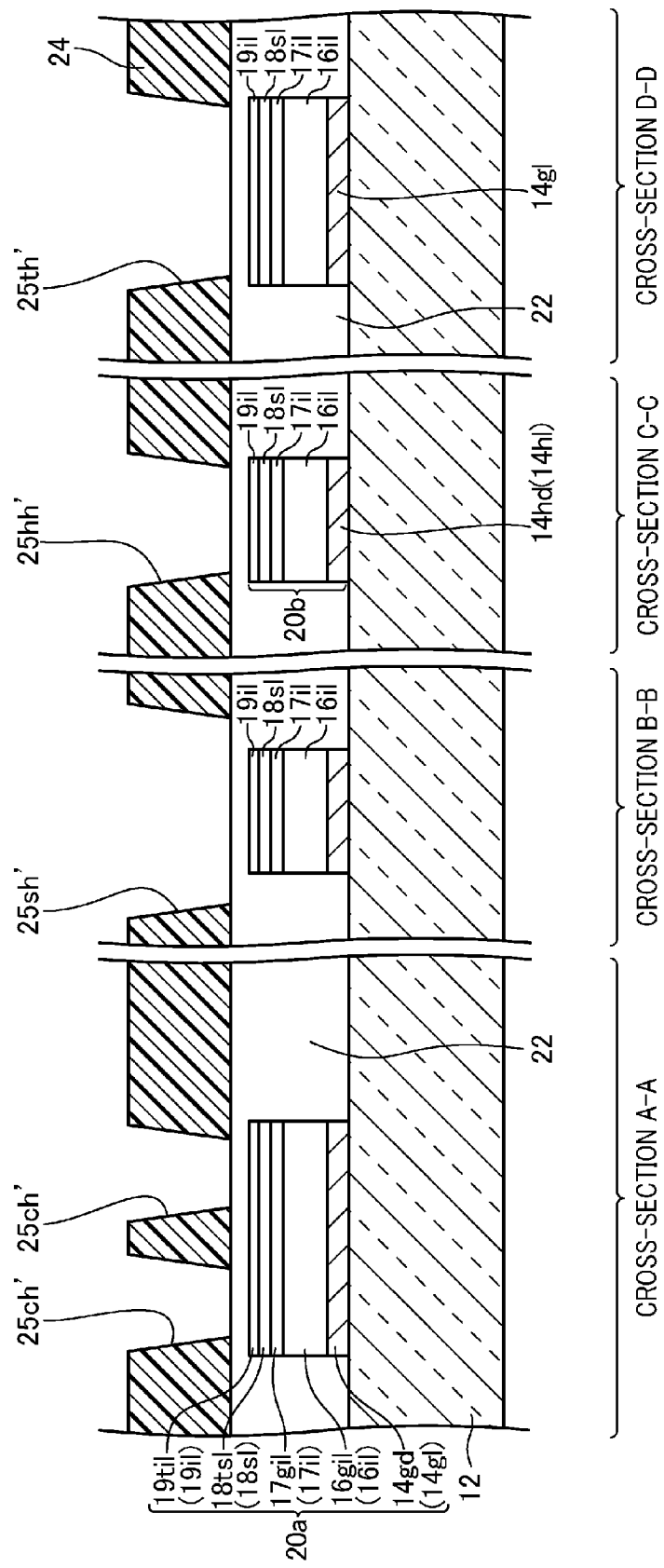
FIG. 17 is a cross-sectional view illustrating the portions corresponding to FIG. 14, wherein a transparent resin insulating film is formed on a SOG film in a second patterning step of the second embodiment.
Figure 18:
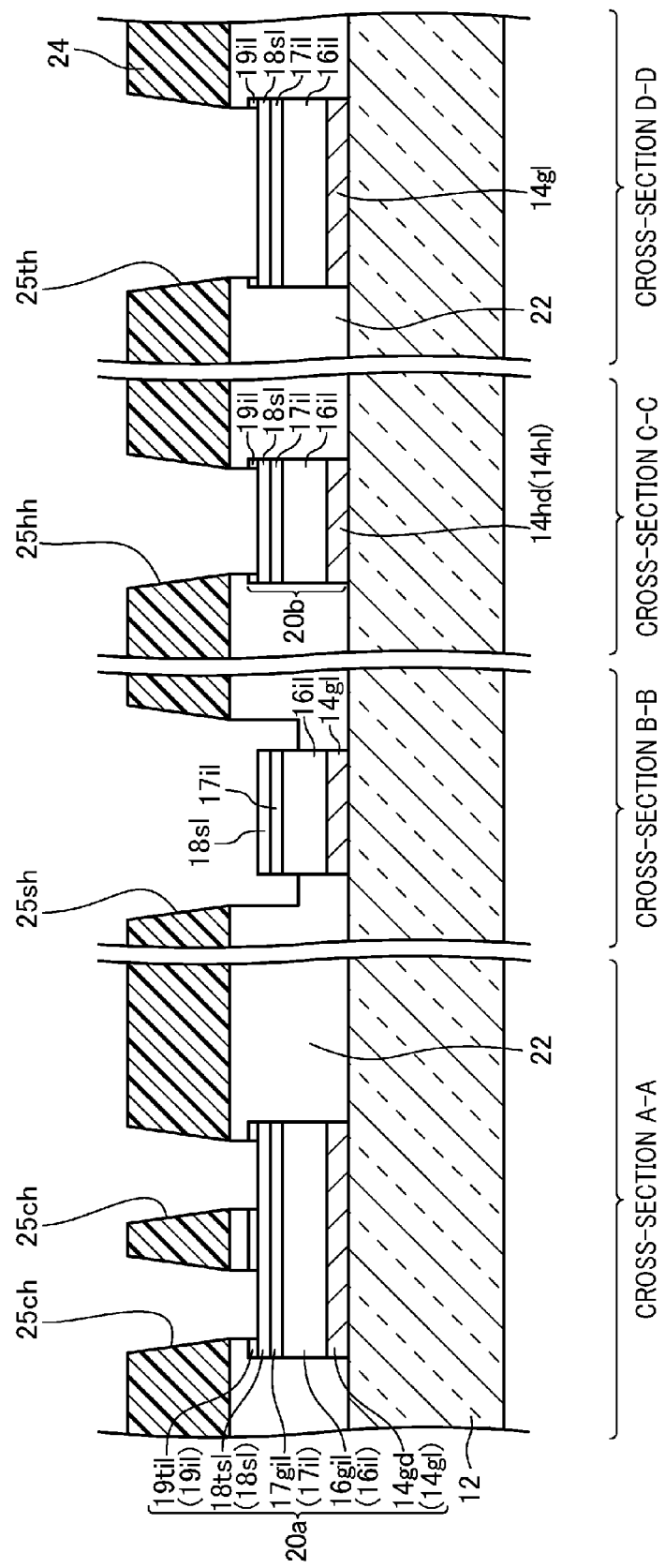
FIG. 18 is a cross-sectional view illustrating the portions corresponding to FIG. 14, wherein in the SOG film, the transparent resin insulating film, and the like, contact holes and various holes are formed in the second patterning step of the second embodiment.
Figure 19:
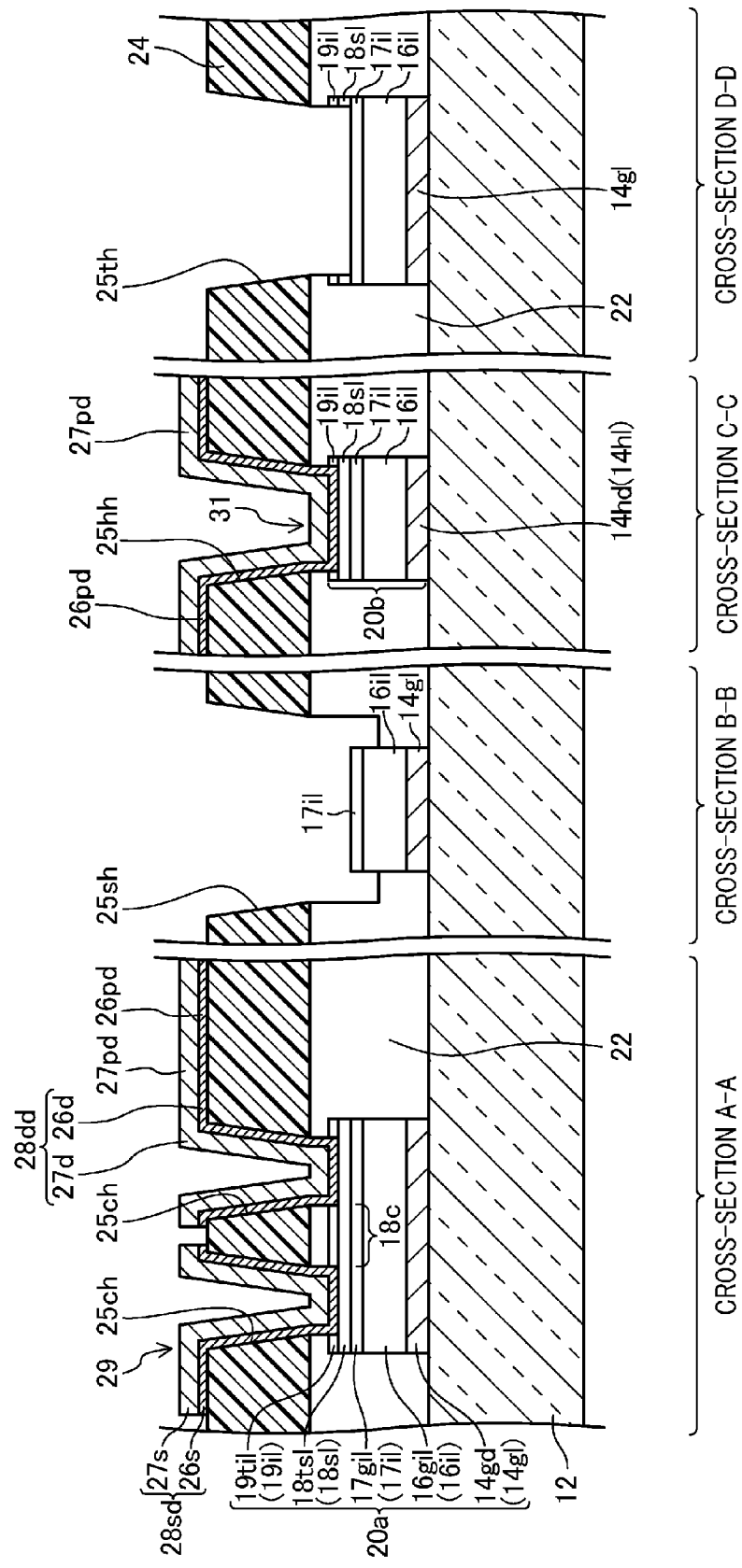
FIG. 19 is a cross-sectional view illustrating the portions corresponding to FIG. 14, wherein source electrodes, drain electrodes, and pixel electrode on which a light shielding conductive layer is stacked are formed in a third patterning step of the second embodiment.
Figure 20:
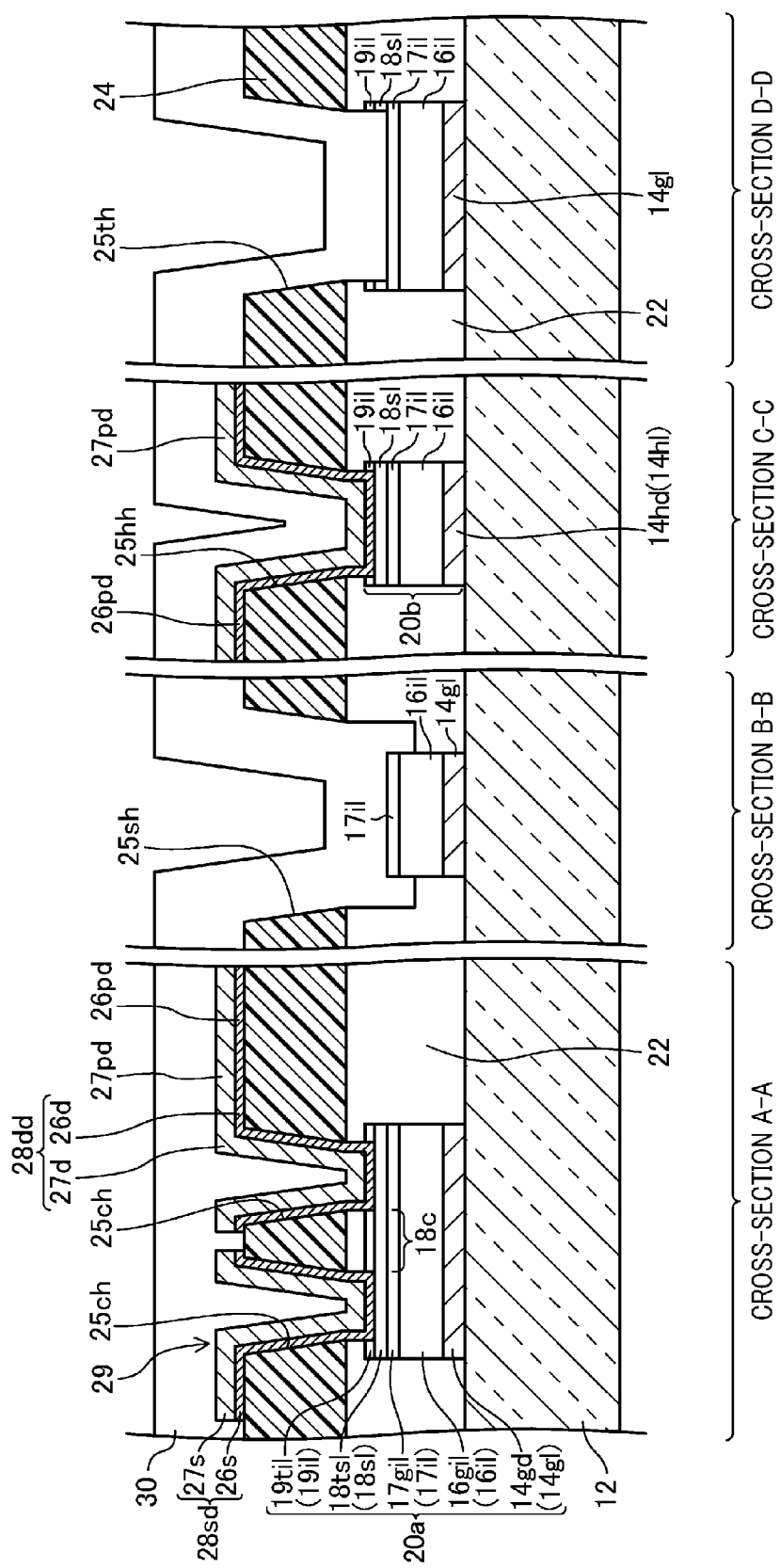
FIG. 20 is a cross-sectional view illustrating the portions corresponding to FIG. 14, wherein a protective insulating film is formed in a fourth patterning step of the second embodiment.
Figure 21:
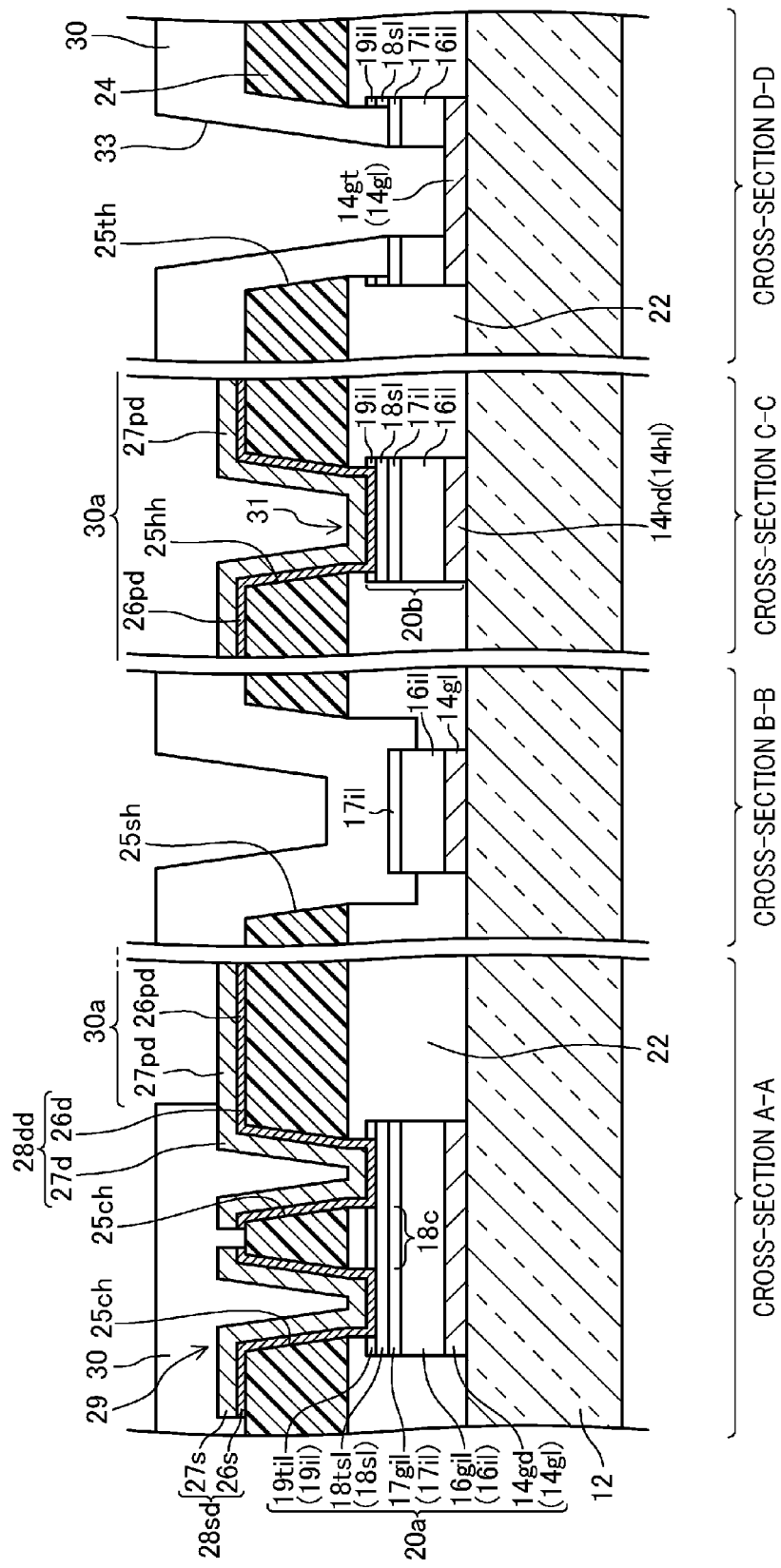
FIG. 21 is a cross-sectional view illustrating the portions corresponding to FIG. 14, wherein in the protective insulating film, openings are formed in positions each corresponding to the pixel electrode in the fourth patterning step of the second embodiment, and in a first insulating layer, a second insulating layer, and the protective insulating film, second terminal section exposing holes are formed in positions each corresponding to an end portion of the gate line.

Next, an example TFT substrate formation step of forming the TFT substrate 10 will be described with reference to FIGS. 15-21. FIG. 15 and FIG. 16 are cross-sectional views illustrating a first patterning step. FIG. 17 and FIG. 18 are cross-sectional views illustrating a second patterning step. FIG. 19 is a cross-sectional view illustrating a third patterning step. FIG. 20 and FIG. 21 are cross-sectional views illustrating a fourth patterning step. Note that FIGS. 15-21 illustrate portions corresponding to FIG. 14.

The TFT substrate formation step of the present embodiment also includes first to fourth patterning steps.

<First Patterning Step>

First, on a prepared insulating substrate 12 such as a glass substrate, for example, an aluminum film, a molybdenum nitride film, and an IZO film are sequentially formed by sputtering, thereby forming a metal multilayer film 14. Subsequently, on the metal multilayer film 14, a first film 16 such as a silicon nitride film and a second film 17 such as a silicon dioxide film are sequentially formed by plasma CVD, thereby forming a multilayer insulating film 16, 17 serving as a first insulating film. Subsequently, on the multilayer insulating film 16, 17, an IGZO-based oxide semiconductor film 18 is formed by sputtering. Thereafter, on the oxide semiconductor film 18, a third insulating film 19 such as a silicon dioxide film is formed by plasma CVD. A multilayer film 20 as illustrated in FIG. 15 is thus formed. Then, the multilayer film 20 is patterned by photolithography using a first photomask.

That is, a resist pattern is formed on the multilayer film 20 in positions in which gate lines 14g1, gate electrodes 14gd, and storage capacitor lines 14h 1 will be formed. Subsequently, using the resist pattern as a mask, the third insulating film 19 is patterned by RIE using, for example, fluorine-based gas, thereby forming a third insulating layer 19i1.

Next, by using the resist pattern and the third insulating layer 19i1 as a mask, the oxide semiconductor film 18 is patterned by etching with, for example, an oxalic acid solution, thereby forming an oxide semiconductor layer 18s1. Subsequently, by using the resist pattern, the third insulating layer 19i1, and the oxide semiconductor layer 18s1 as a mask, the multilayer insulating film (the first film and the second film) 16, 17 is patterned by RIE using, for example, fluorine-based gas, thereby forming a first insulating layer 16i1 and a second insulating layer 17i1.

Moreover, by using the resist pattern, the third insulating layer 19i1, the oxide semiconductor layer 18s1, the second insulating layer 17i1, and the first insulating layer 16i1 as a mask, the metal multilayer film (the aluminum film, the molybdenum nitride film, and the IZO film) 14 is patterned by etching with a mixed solution of, for example, phosphoric acid, acetic acid, and nitric acid. Then, the resist pattern is removed by cleaning with a resist remover solution. The gate lines 14g1, the gate electrodes 14gd, and the storage capacitor lines 14h 1 are thus formed.

Through the foregoing processes, multilayer structures 20a, 20b as illustrated in FIG. 16 are formed. The multilayer structure 20a includes the gate line 14g1 and the gate electrode 14gd, and the first insulating layer 16i1, the second insulating layer 17i1, the oxide semiconductor layer 18s1, and the third insulating layer 19i1 which are sequentially formed on the gate line 14g1 and the gate electrode 14gd. The multilayer structure 20b includes the storage capacitor line 14h 1, and the first insulating layer 16i1, the second insulating layer 17i1, the oxide semiconductor layer 18s1, and the third insulating layer 19i1 which are sequentially formed on the storage capacitor line 14h 1. In the thus formed multilayer structure 20a, part of the first insulating layer 16i1 and part of the second insulating layer 17i1 which correspond to the gate electrode 14gd respectively form a first gate insulating layer 16gi1 and a second gate insulating layer 17gi1, and part of the oxide semiconductor layer 18s1 which corresponds to the gate electrode 14gd forms an oxide semiconductor layer 18ts1 of the TFT 29.

<Second Patterning Step>

On the substrate provided with the multilayer structures 20a, 20b, a SOG film 22 is formed in the same manner as the first embodiment. Next, a transparent resin insulating material is applied to the SOG film 22 by spin coating or slit coating, and a film made of the material is exposed to light via a second photomask, and then is developed. In this way, as illustrated in FIG. 17, a transparent resin insulating film 24 is formed, wherein holes 25ch', 25sh', 25hh', 25th' which are parts of contact holes 25ch, and various holes 25sh, 25hh, 25th are formed in the transparent resin insulating film 24. The SOG film 22 and the transparent resin insulating film 24 form a second insulating film of the present embodiment.

Then, by using the transparent resin insulating film 24 as a mask, the SOG film 22 and the third insulating layer 19i1 are patterned by RIE using, for example, fluorine-based gas. As a result, as illustrated in FIG. 18, a pair of contact holes 25ch extending to the oxide semiconductor layer 18ts1 is formed in a position corresponding to each gate electrode 14gd, channel isolation holes 25sh extending to the oxide semiconductor layer 18s1 are formed in positions each of which is located between adjacent two of the gate electrodes 14gd connected to a common one of the gate lines 14g1 and corresponds to the common gate line 14g1, storage capacitor formation holes 25hh extending to the oxide semiconductor layer 18s1 are formed in positions each corresponding to the storage capacitor line 14h 1 are formed, and first terminal section exposing holes 25th are formed in positions each corresponding to an end portion of the gate line 14g1, wherein the contact holes 25ch, the channel isolation holes 25sh, the storage capacitor formation holes 25hh, and the first terminal section exposing holes 25th are respectively continuous with the holes 25ch', 25sh', 25hh', and 25th' formed in the transparent resin film 24. Thus, the third insulating layer 19i1, the SOG film 22, and the transparent resin insulating film 24 serve as a stopper insulating film. Here, each channel isolation hole 25sh is formed to have a large width, so that part of the oxide semiconductor layer 18s1 corresponding to a total width of the gate line 14g1 is exposed in the channel isolation hole 25sh in the width direction of the gate line 14g1.

<Third Patterning Step>

On the substrate provided with the SOG film 22 and the transparent resin insulating film 24, a transparent conductive film 26 such as an ITO film is formed by sputtering. Subsequently, on the transparent conductive film 26, for example, a molybdenum nitride film, an aluminum film, and a molybdenum nitride film are sequentially formed by sputtering, thereby forming a light-shielding conductive film 27. Thus, a multilayer conductive film 28 serving as a second conductive film in which the transparent conductive film 26 and the light-shielding conductive film 27 are sequentially staked is formed.

Next, on the multilayer conductive film 28, a resist pattern is formed by using a third photomask in positions in which source lines 28s1, source electrodes 28sd, drain electrodes 28dd, and pixel electrodes 26pd will be formed. Then, by using the resist pattern as a mask, the light-shielding conductive film (the molybdenum nitride film, the aluminum film, and the molybdenum nitride film) 27 is etched with a mixed solution of, for example, phosphoric acid, acetic acid, and nitric acid. Subsequently, the transparent conductive film 26 is etched with, for example, an oxalic acid solution, thereby patterning the multilayer conductive film 28. After that, the resist pattern is removed by cleaning with a resist remover solution. In this way, as illustrated in FIG. 19 (cross section A-A), the source line 28s1, the source electrode 28sd, and the drain electrode 28dd are formed, thereby forming the TFT 29 and the pixel electrode 26pd provided with the light shielding conductive layer 27pd. Here, the third insulating layer 19i1, the SOG film 22, and the transparent resin insulating film 24 serve as an etching stopper on the channel region 18c, and thus the channel region 18c is not damaged by etching.

Moreover, simultaneously with patterning the transparent conductive film 26, as illustrated in FIG. 19 (cross-section B-B), the oxide semiconductor layer 18s1 is divided by removing part of the oxide semiconductor layer 18s1 located in a position corresponding to the gate line 14g1 in the channel isolation hole 25sh. Here, the part of the oxide semiconductor layer 18s1 corresponding to a total width of the gate line 14g1 is exposed in the channel isolation hole 25sh. Thus, removing the part of the oxide semiconductor layer 18s1 ensures division of the oxide semiconductor layer 18ts1 of the adjacent gate electrodes 14gd connected to the common gate line 14g1. Together with the above-described process, as illustrated in FIG. 19 (cross-section D-D), part of the oxide semiconductor layer 18s1 is removed in the first terminal section exposing hole 25th to expose the second insulating layer 17i1.

<Fourth Patterning Step>

As illustrated in FIG. 20, a protective insulating film 30 made of, for example, silicon dioxide is formed by plasma CVD on the substrate provided with the source lines 28s1, the source electrodes 28sd, the drain electrodes 28dd, and the pixel electrodes 26pd provided with the light shielding conductive layers 27pd.

Then, by using a fourth photomask, a resist pattern is formed on the protective insulating film 30 except for regions corresponding to the pixel electrode 26pd, end portions of the source lines 28s1, and the first terminal section exposing holes 25th. Then, by using the resist pattern as a mask, the protective insulating film 30 is patterned by RIE using, for example, fluorine-based gas. Thereafter, the resist pattern is removed by cleaning with a resist remover solution. In this way, as illustrated in FIG. 21, in the protective insulating film 30, openings 30a are formed in positions each corresponding to the pixel electrode 26pd, and terminal section exposing holes 30th are formed in positions each corresponding to the end portion of the source line 28s1. Moreover, in the first insulating layer 16i1, the second insulating layer 17i1, and the protective insulating film 30, second terminal section exposing holes 33 are formed in positions each corresponding to the first terminal section exposing hole 25th. The end portions of the source lines 28s1 are exposed from the terminal section exposing holes 30th to the outside, thereby forming source terminal sections 28st. The end portions of the gate lines 14g1 are exposed from the second terminal section exposing holes 33 to the outside, thereby forming gate terminal sections 14gt.

Subsequently, by using the resist pattern and the protective insulating film 30 as a mask, the light shielding conductive layer 27pd on the pixel electrodes 26pd is removed by RIE using, for example, chlorine-based gas in the openings 30a in the protective insulating film 30. After that, the resist pattern is removed by cleaning with a resist remover solution. Thus, the pixel electrodes 26pd each including only a transparent conductive layer are exposed to the outside.

The TFT substrate 10 can thus be formed.

Advantages of Second Embodiment

Similar to the first embodiment, according to the second embodiment, a TFT 29 having satisfactory characteristics can be obtained by using an oxide semiconductor, and a TFT substrate 10 including the TFT 29 can be formed at low cost with the number of photomasks being reduced.

Third Embodiment of Invention

Figure 22:
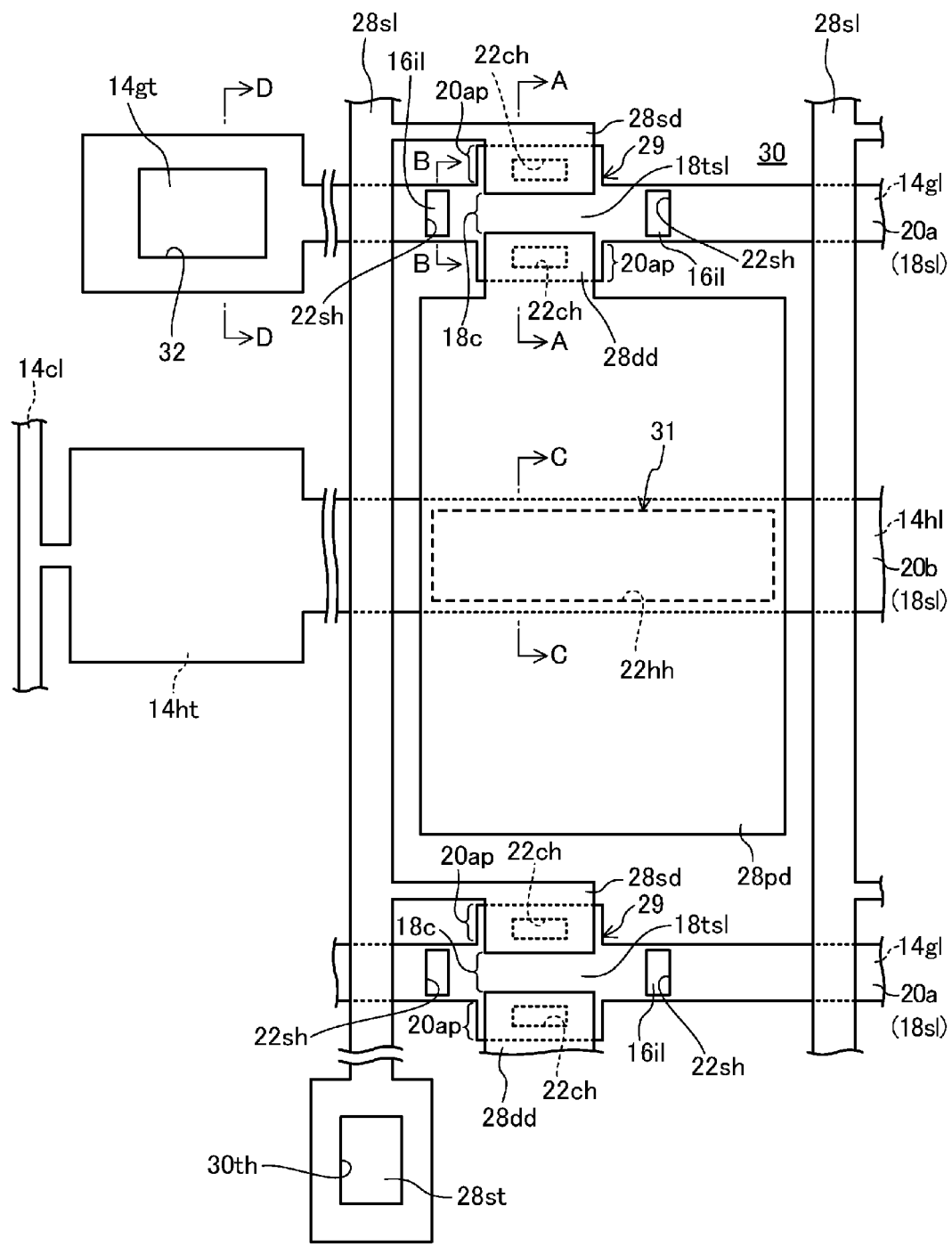
FIG. 22 is a plan view schematically illustrating a configuration of one pixel and terminal sections of a TFT substrate of a third embodiment.

FIG. 22 is a plan view schematically illustrating a configuration of one pixel and terminal sections of a TFT substrate 10 according to a third embodiment. FIG. 23 are cross-sectional view in which cross-sectional structures along the lines A-A, B-B, C-C, and D-D of FIG. 22 are shown from the left. The present embodiment is formed to have the same configuration as the first embodiment except that the configuration of the TFT substrate 10 is different from that of the first embodiment. Thus, only the TFT substrate 10, the configuration of which is different from that of the first embodiment, will be described.

The TFT substrate 10 of the present embodiment is a TFT substrate applied to reflective liquid crystal display devices, and includes pixel electrodes 28pd which are made of a film identical to a film forming source electrodes 28sd and drain electrodes 28dd, and are formed by sequentially stacking, for example, an aluminum (Al) layer and a molybdenum nitride (MoN) layer. The pixel electrodes 28pd are covered with a protective insulating film 30.

—Fabrication Method—

Next, a TFT substrate formation step of forming the TFT substrate 10 will be described with reference to FIG. 24 and FIG. 25. FIG. 24 is a cross-sectional view illustrating a third patterning step. FIG. 25 is a cross-sectional view illustrating a fourth patterning step. Note that FIG. 24 and FIG. 25 illustrate portions corresponding to FIG. 23.

The TFT substrate formation step of the present embodiment also includes first to fourth patterning steps. Here, the first patterning step and the second patterning step are similar to those of the first embodiment, and thus description thereof is omitted.

<Third Patterning Step>

On the substrate provided with the SOG film 22, for example, a molybdenum nitride film and an aluminum film are sequentially formed by sputtering, thereby forming a metal multilayer film serving as a second conductive film.

Next, on the metal multilayer film, a resist pattern is formed by using a third photomask in positions in which source lines 28s1, the source electrodes 28sd, the drain electrodes 28dd, and the pixel electrodes 28pd will be formed. Then, by using the resist pattern as a mask, the metal multilayer film (the molybdenum nitride film and the aluminum film) is patterned by etching with a mixed solution of, for example, phosphoric acid, acetic acid, and nitric acid. After that, the resist pattern is removed by cleaning with a resist remover solution. In this way, as illustrated in FIG. 24 (cross-section A-A), the source line 28s1, the source electrode 28sd, and the drain electrode 28dd are formed, thereby forming the TFT 29, and the pixel electrode 28pd is formed. Here, the SOG film 22 serves as an etching stopper on a channel region 18c, and thus the channel region 18c is not damaged by etching.

Moreover, simultaneously with patterning the metal multilayer film, part of the oxide semiconductor layer 18s1 is removed via the channel isolation hole 22sh, thereby dividing the oxide semiconductor layer 18s1, so that an oxide semiconductor layer 14ts1 of the TFTs 29 is divided, and part of the oxide semiconductor layer 18s1 is removed via the first terminal section exposing hole 22th to expose the insulating layer 16i1.

<Fourth Patterning Step>

As illustrated in FIG. 25, a protective insulating film 30 is formed in a manner similar to that of the first embodiment on the substrate provided with the source lines 28s1, the source electrodes 28sd, the drain electrodes 28dd, and the pixel electrodes 28pd. Then, by using a fourth photomask, a resist pattern is formed on the protective insulating film 30 except for positions corresponding to end portions of the source lines 28s1 and the first terminal section exposing holes 22th. Then, by using the resist pattern as a mask, the protective insulating film 30 is patterned by etching. Thereafter, the resist pattern is removed by cleaning with a resist remover solution. In this way, terminal section exposing holes 30th are formed in positions each corresponding to the end portion of the source line 28s1, and in the protective insulating film 30 and the insulating layer 16i1, second terminal section exposing holes 32 are formed in positions each corresponding to the first terminal section exposing hole 22th. The end portions of the source lines 28s1 are exposed from the terminal section exposing holes 30th to the outside, thereby forming source terminal sections 28st. The end portions of the gate lines 14g1 are exposed from the second terminal section exposing holes 32 to the outside, thereby forming gate terminal sections 14gt.

The TFT substrate 10 can thus be formed.

Advantages of Third Embodiment

Similar to the first embodiment, according to the third embodiment, a TFT 29 having satisfactory characteristics can be obtained by using an oxide semiconductor, and a TFT substrate 10 which includes the TFT 29 and is applied to reflective liquid crystal display devices S can be formed at low cost with the number of photomasks being reduced.

Note that the embodiments have described the configuration in which the channel isolation holes 22sh, 25sh are each formed in part of positions corresponding to the gate line 14g1 except for a part forming the gate electrode 14gd, and the oxide semiconductor layer 18s1 is provided on the insulating layers 16i1, 17i1 in the other parts of positions corresponding to the gate line 14g1, but are not intended to limit the present invention. The channel isolation holes 22sh, 25sh may be formed in overall positions corresponding to the gate line 14g1 except for a part forming the gate electrode 14gd, and no oxide semiconductor layer 18s1 may be provided on a position of the insulating layers 16i1, 17i1 corresponding to the gate line 14g1 except for a part forming the gate electrode 14gd.

Moreover, the embodiments have described the TFT substrate 10 included in the liquid crystal display device S, but are not intended to limit the present invention. The present invention is applicable to other display devices such as organic electro luminescence (EL) display devices, TFT substrates included in such display devices, and methods for fabricating the same.

While the present invention has been described with reference to the preferred embodiments, the technical scope of the present invention is not limited thereto. It is to be understood by those skilled in the art that the embodiments are mere examples, various modifications can be added to the components and the combinations of the processes of the preferred embodiments above, and such modified implementations fall within the scope of the present invention.

INDUSTRIAL APPLICABILITY

As described above, the present invention is useful to TFT substrates, liquid crystal display devices including the TFT substrates, and methods for fabricating the TFT substrates. In particular, the present invention is suitable for TFT substrates, liquid crystal display devices including the TFT substrates, and methods for fabricating the TFT substrates in which it is desired to obtain TFTs having satisfactory characteristics by using oxide semiconductors, and fabricate the TFT substrates including the TFTs at low cost.

DESCRIPTION OF REFERENCE CHARACTERS

S Liquid Crystal Display Device
10 TFT Substrate (Thin film transistor Substrate)
12 Insulating Substrate (Base Substrate)
14 Metal Multilayer Film (First Conductive Film)
14g1 Gate line
14gd Gate Electrode
16 First Insulating Film
16i1 Insulating Layer, First Insulating Layer
16gi1 Gate Insulating Layer, First Gate Insulating Layer
17i1 Second Insulating Layer
17gi1 Second Gate Insulating Layer
18 Oxide Semiconductor Film
18c Channel Region
18s1, 18ts1 Oxide Semiconductor Layer
20 Multilayer Film
20a Multilayer Structure
22 SOG Film (Second Insulating Film, Stopper Insulating Film)
24 Transparent Resin Insulating Film
22ch, 25ch Contact Hole
22sh, 25sh Channel Isolation Hole 22th, 25th First Terminal Section Exposing Hole (Terminal Section Exposing Hole)
26s, 26d Transparent Conductive Layer
26pd Pixel Electrode
27s, 27d Light Shielding Conductive Layer
28 Multilayer Conductive Film (Second Conductive Film)
28s1 Source line
28gd Source Electrode
28dd Drain Electrode
29 TFT (Thin film transistor)
30 Protective Insulating Film
30a Opening
50 Counter Substrate
51 Liquid Crystal Layer

The invention claimed is:

1. A thin film transistor substrate comprising:
a base substrate;
a plurality of gate lines extending parallel to each other on the base substrate;
a plurality of source lines extending parallel to each other in a direction intersecting the gate lines;
thin film transistors each of which is provided at an associated one of intersections of the gate lines and the source lines; and
pixel electrodes each of which is provided to an associated one of the thin film transistors, wherein
each of the thin film transistors includes a gate electrode connected to the gate line forming an associated one of the intersections, a gate insulating layer provided on the gate electrode, an oxide semiconductor layer provided on the gate insulating layer and including a channel region overlapping the gate electrode, a source electrode connected to one side of the oxide semiconductor layer and connected to the source line forming the associated one of the intersections, and a drain electrode connected to the other side of the oxide semiconductor layer such that the drain electrode faces the source electrode,
each of the thin film transistors is configured such that side end faces of the gate electrode, the gate insulating layer, and the oxide semiconductor layer are formed to be flush with one another to form a multilayer structure, a stopper insulating film is provided to cover the multilayer structure, a pair of contact holes for connection to the oxide semiconductor layer is formed in the stopper insulating film to connect the source electrode to the oxide semiconductor layer via one of the contact holes, and to connect the drain electrode to the oxide semiconductor layer via the other of the contact holes, and the stopper insulating film serves as an etching stopper on the channel region when the source electrode and the drain electrode are formed,
an insulating layer made of a film identical to a film forming the gate insulating layer is stacked also on the gate lines,
the stopper insulating film is provided to cover at least part of side end faces of the gate lines and of the insulating layer,
the stopper insulating film has channel isolation holes formed in positions each of which is located between adjacent two of the thin film transistors connected to a common one of the gate lines, and corresponds to the common gate line, where the oxide semiconductor layer of the adjacent thin film transistors is divided in each of the channel isolation holes so as to isolate the channel regions of the adjacent thin film transistors from each other,
the stopper insulating film has terminal section exposing holes formed in positions each corresponding to an end portion of the gate line, where the end portion of the gate line is exposed in each of the terminal section exposing holes from the insulating layer to form a terminal section,
each of the pixel electrodes is made of a film identical to at least one layer included in the drain electrode,
the thin film transistors are covered with a protective insulating film,
each of the drain electrodes includes a transparent conductive layer and a light shielding conductive layer which are sequentially stacked,
each of the pixel electrodes is made of a film identical to a film forming the transparent conductive layer,
in the protective insulating film, openings are formed in positions each corresponding to the pixel electrode, and
the light shielding conductive layer of each of the drain electrodes has an end face facing an associated one of the pixel electrodes, where the end face matches an inner surface of the opening in the protective insulating film.

2. The thin film transistor substrate of claim 1, wherein
each of the channel isolation holes is formed to fit within the position of the stopper insulating film corresponding to the gate line, and
the oxide semiconductor layer is formed also on the region corresponding to the gate line, and serves as an etching stopper when the channel isolation holes are formed in the stopper insulating film.

3. The thin film transistor substrate of claim 1, wherein
each of the channel isolation holes is formed in the position of the stopper insulating film corresponding to the gate line to extend across the gate line in a width direction of the gate line.

4. The thin film transistor substrate of claim 1, wherein
the stopper insulating film is made of a spin-on glass material.

5. The thin film transistor substrate of claim 1, wherein
the oxide semiconductor layer is made of indium-gallium-zinc-oxide-based metal oxide.

6. A liquid crystal display device comprising:
a thin film transistor substrate of claim 1;
a counter substrate provided to face the thin film transistor substrate; and
a liquid crystal layer provided between the thin film transistor substrate and the counter substrate.

7. A method for fabricating the thin film transistor substrate of claim 1, the method comprising:
a first patterning step of
sequentially forming a first conductive film, a first insulating film, and an oxide semiconductor film on the base substrate to form a multilayer film, and then patterning the multilayer film by using a first photomask to form the gate lines and the gate electrodes from the first conductive film, the insulating layer from the first insulating film, and the oxide semiconductor layer from the oxide semiconductor film such that a multilayer structure including the gate lines, the gate electrodes, and the insulating layer and the oxide semiconductor layer which are sequentially stacked on the gate lines and the gate electrodes is formed, where part of the insulating layer which corresponds to the gate electrodes form the gate insulating layer;
a second patterning step of
forming a second insulating film to cover the multilayer structure, and then patterning the second insulating film by using a second photomask to form a pair of contact holes extending to the oxide semiconductor layer in positions corresponding to each of the gate electrodes, channel isolation holes extending to the oxide semiconductor layer in positions each of which is located between adjacent two of the gate electrodes connected to a common one of the gate lines, and corresponds to the common gate line, and terminal section exposing holes in positions each corresponding to an end portion of the gate line so that the second insulating film serves as the stopper insulating film;

a third patterning step of forming a second conductive film on the stopper insulating film, and then by using the stopper insulating film as an etching stopper, patterning the second conductive film by using a third photomask to form the source lines, the source electrodes, the drain electrodes, and the pixel electrodes, dividing the oxide semiconductor layer by removing part of the oxide semiconductor layer via each of the channel isolation holes so that parts of the oxide semiconductor layer which are located above the adjacent gate electrodes connected to the common gate line are isolated from each other, and removing part of the oxide semiconductor layer via each of the terminal section exposing holes to expose the insulating layer; and a fourth patterning step of patterning the insulating layer exposed from the stopper insulating film via the terminal section exposing holes by using a fourth photomask to expose end portions of the gate lines from the insulating layers to form terminal sections of the gate lines.

* * * * *